United States Patent
Schwede et al.

(10) Patent No.: US 12,102,005 B2
(45) Date of Patent: *Sep. 24, 2024

(54) SYSTEM AND METHOD FOR WORK FUNCTION REDUCTION AND THERMIONIC ENERGY CONVERSION

(71) Applicant: Spark Thermionics, Inc., Berkeley, CA (US)

(72) Inventors: Jared William Schwede, Berkeley, CA (US); Lucas Heinrich Hess, Berkeley, CA (US)

(73) Assignee: Spark Thermionics, Inc., Berkeley, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/993,195

(22) Filed: Nov. 23, 2022

(65) Prior Publication Data

US 2023/0093228 A1    Mar. 23, 2023

Related U.S. Application Data

(60) Continuation of application No. 16/715,705, filed on Dec. 16, 2019, now Pat. No. 11,552,233, which is a (Continued)

(51) Int. Cl.
*H10N 10/13* (2023.01)
*H01J 45/00* (2006.01)
(Continued)

(52) U.S. Cl.
CPC ............. *H10N 10/13* (2023.02); *H01J 45/00* (2013.01); *H10N 10/851* (2023.02); *H10N 10/853* (2023.02); *H10N 10/855* (2023.02)

(58) Field of Classification Search
CPC .... H10N 10/13; H10N 10/855; H10N 10/853; H10N 10/851; H01J 45/00
See application file for complete search history.

(56) References Cited

U.S. PATENT DOCUMENTS

| | | |
|---|---|---|
| 3,155,849 A | 11/1964 | Lawrence et al. |
| 3,173,032 A | 3/1965 | Maynard |

(Continued)

FOREIGN PATENT DOCUMENTS

| | | |
|---|---|---|
| CA | 2367686 A1 | 10/2000 |
| CN | 204285609 U | 4/2015 |

(Continued)

OTHER PUBLICATIONS

Chung et al., KR 20170037107 A, English Machine Translation. (Year: 2017).*

(Continued)

*Primary Examiner* — Tae-Sik Kang
(74) *Attorney, Agent, or Firm* — Jeffrey Schox; Samuel Rosenthal

(57) ABSTRACT

A thermionic energy converter, preferably including an anode and a cathode. An anode of a thermionic energy converter, preferably including an n-type semiconductor, one or more supplemental layers, and an electrical contact. A method for work function reduction and/or thermionic energy conversion, preferably including inputting thermal energy to a thermionic energy converter, illuminating an anode of the thermionic energy converter, thereby preferably reducing a work function of the anode, and extracting electrical power from the system.

18 Claims, 9 Drawing Sheets

Related U.S. Application Data continuation of application No. 16/218,032, filed on Dec. 12, 2018, now Pat. No. 10,546,990, which is a division of application No. 15/969,027, filed on May 2, 2018, now Pat. No. 10,186,650.

(60) Provisional application No. 62/595,003, filed on Dec. 5, 2017, provisional application No. 62/500,300, filed on May 2, 2017.

(51) Int. Cl.
*H10N 10/851* (2023.01)
*H10N 10/853* (2023.01)
*H10N 10/855* (2023.01)

(56) References Cited

U.S. PATENT DOCUMENTS

| | | | |
|---|---|---|---|
| 3,201,618 A * | 8/1965 | Coleman | H01J 45/00 310/306 |
| 3,477,012 A | 11/1969 | Laing | |
| 3,482,120 A | 12/1969 | Wilson | |
| 3,634,141 A | 1/1972 | Hirashima | |
| 3,740,592 A | 6/1973 | Engdahl et al. | |
| 3,843,895 A | 10/1974 | Stelzenmuller et al. | |
| 3,843,896 A | 10/1974 | Rason et al. | |
| 3,932,776 A | 1/1976 | Dunlay et al. | |
| 5,495,829 A | 3/1996 | Jayaraman et al. | |
| 5,612,588 A | 3/1997 | Wakalopulos | |
| 5,675,972 A | 10/1997 | Edelson | |
| 5,955,772 A | 9/1999 | Shakouri et al. | |
| 10,056,538 B1 | 8/2018 | Boyd | |
| 10,186,650 B2 | 1/2019 | Schwede et al. | |
| 10,546,990 B2 | 1/2020 | Schwede et al. | |
| 10,699,886 B2 | 6/2020 | Schmitt et al. | |
| 11,133,757 B2 | 9/2021 | Lorimer et al. | |
| 11,205,554 B1 | 12/2021 | Riley et al. | |
| 11,264,144 B2 | 3/2022 | Houten et al. | |
| 11,688,593 B2 | 6/2023 | Schmitt et al. | |
| 2005/0110099 A1 | 5/2005 | Shimogishi et al. | |
| 2008/0061158 A1 | 3/2008 | Nakagawa et al. | |
| 2009/0127549 A1 * | 5/2009 | Walitzki | H01J 45/00 257/467 |
| 2010/0019619 A1 | 1/2010 | Hagg | |
| 2010/0060136 A1 | 3/2010 | Gartner et al. | |
| 2010/0104450 A1 | 4/2010 | Longoni et al. | |
| 2010/0139771 A1 * | 6/2010 | Schwede | H01J 45/00 136/261 |
| 2010/0187413 A1 | 7/2010 | Difoggio et al. | |
| 2011/0100430 A1 * | 5/2011 | Zak, Jr. | H01G 9/2022 136/248 |
| 2011/0139205 A1 | 6/2011 | Kimura et al. | |
| 2011/0221328 A1 | 9/2011 | Nemanich et al. | |
| 2011/0226299 A1 | 9/2011 | Makansi | |
| 2012/0085094 A1 | 4/2012 | Davis et al. | |
| 2012/0299438 A1 | 11/2012 | Kimura et al. | |
| 2014/0187016 A1 | 7/2014 | Malhotra et al. | |
| 2014/0306575 A1 | 10/2014 | Paxton et al. | |
| 2017/0016631 A1 | 1/2017 | Shaffer | |
| 2018/0323362 A1 | 11/2018 | Schwede et al. | |
| 2019/0027347 A1 | 1/2019 | Schwede et al. | |
| 2019/0196465 A1 | 6/2019 | Hummelshøj | |
| 2020/0119249 A1 | 4/2020 | Schwede et al. | |
| 2020/0321203 A1 | 10/2020 | Schmitt et al. | |

FOREIGN PATENT DOCUMENTS

| | | |
|---|---|---|
| JP | S543356 B1 | 2/1979 |
| JP | H0575104 A | 3/1993 |
| JP | H08125232 A | 5/1996 |
| JP | 2005158917 A | 6/2005 |
| JP | 2008228386 A | 9/2008 |
| JP | 2008294129 A | 12/2008 |
| JP | 2010516046 A | 5/2010 |
| JP | 2011124412 A | 6/2011 |
| JP | 2012514856 A | 6/2012 |
| JP | 2018014161 A | 1/2018 |
| JP | 2018137096 A | 8/2018 |
| KR | 20170037107 A * | 4/2017 |
| WO | 2008085757 A2 | 7/2008 |
| WO | 2010078521 A1 | 7/2010 |
| WO | 2018204470 A1 | 11/2018 |

OTHER PUBLICATIONS

Kim, J. , et al., "Kelvin probe and ultraviolet photoemission measurements of indium tin oxide work function: a comparison", Synthetic Metals, vol. 111-112, pp. 311-314, Jun. 1, 2000; <URL: https://www.sciencedirect.com/science/articles/abs/pii/S0379677999003549>; abstract;section 2, p. 313; table1.

Martini, W.R. , et al., "Internal flame-heated thermionic converters", In Thermionic specialist conference, p. 356. 1963.

Meza, Lucas R., "Strong, lightweight, and recoverable three-dimensional ceramic nanolattices", Sep. 12, 2014 • vol. 345 Issue 6202.

Raja, W. , et al., "Photon-Enhanced Thermionic Emission", Final Report, Instituto Italiano di Technolgia (IIT), May 10, 20215, pp. 1-28 (Year: 2015).

Riley, Daniel C , "Application of Semiconductors to Thermionic Energy Converters", A Dissertation Submitted to the Department of Physics and the Committee on Graduate Studies of Stanford University, Jun. 2015.

Schaedler, T.A. , "Ultralight Metallic Microlattices", Nov. 18, 2011 vol. 334 Science www.sciencemag.org.

Schwede, Jared W. , et al., "Photon-enhanced 1-15 thermionic emission for solar concentrator systems", Nature Materials, vol. 9, No. 9, Aug. 1, 2010 (Aug. 1, 2010).

Schwede, J.W. , et al., "Photon-enhanced thermionic emission from heterostructures with low interface recombination", Nature Communications, vol. 4, No. 1, Jun. 12, 2013 (Jun. 12, 2013), XP055759289, DOI: 10.1038/ncomms2577.

Varpula, Aapo , et al., "Diffusion-emission theory of photon enhanced thermionic emission solar energy harvesters", Journal of Applied Physics, American Institute of Physics, US, vol. 112, No. 4, Aug. 15, 2012 (Aug. 15, 2012), pp. 44506-44506, XP012166538.

Segev, Gideon , et al., "High performance isothermal photo-thermionic solar converters", Solar Energy Materials and Solar Cells vol. 113, Jun. 2013, pp. 114-123.

Meir, S. , et al., "Highly-Efficient Thermoelectronic Conversion of Solar Energy and Heat into Electric Power", arXiv:1301.3505v1 [cond-matrl-sci] Jan. 15, 2013.

Moody, N.A. , et al., "Prototype dispenser photocathode: Demonstration and comparison to theory", Applied Physics Letter 90, 114108 (2007).

Stephanos, Cyril , "Thermoelectronic Power Generation from Solar Radiation and Heat", Dissertation University of Augsburg, Nov. 2012.

\* cited by examiner

SYSTEM AND METHOD FOR WORK FUNCTION REDUCTION AND THERMIONIC ENERGY CONVERSION

CROSS-REFERENCE TO RELATED APPLICATIONS

This application is a continuation of U.S. patent application Ser. No. 16/715,705, filed 16 Dec. 2019, which is a continuation of U.S. patent application Ser. No. 16/218,032, filed 12 Dec. 2018, which is a divisional application of U.S. patent application Ser. No. 15/969,027, filed 2 May 2018 (Issued as U.S. Pat. No. 10,186,650 on 22 Jan. 2019) which claims the benefit of U.S. Provisional Application No. 62/500,300, filed on 2 May 2017, and U.S. Provisional Application No. 62/595,003, filed on 5 Dec. 2017, each of which is incorporated in its entirety by this reference.

STATEMENT OF GOVERNMENT SUPPORT

This invention was made with government support under Award Number ARPA-E-DE-AR00000664 awarded by the Advanced Research Projects Agency-Energy and under Contract Numbers HR0011-17-P-0003 and W911NF-17-P-0034 awarded by the Defense Advanced Research Projects Agency. The government has certain rights in the invention.

TECHNICAL FIELD

This invention relates generally to the thermionic energy conversion field, and more specifically to a new and useful system and method for work function reduction in the thermionic energy conversion field.

BACKGROUND

Large anode work functions can limit the power conversion efficiency of thermionic energy converters. Thus, there is a need in the thermionic energy conversion field to create a new and useful system and method for work function reduction.

DESCRIPTION OF THE PREFERRED EMBODIMENTS

The following description of the preferred embodiments of the invention is not intended to limit the invention to these preferred embodiments, but rather to enable any person skilled in the art to make and use this invention.

1. System

Figure 1:
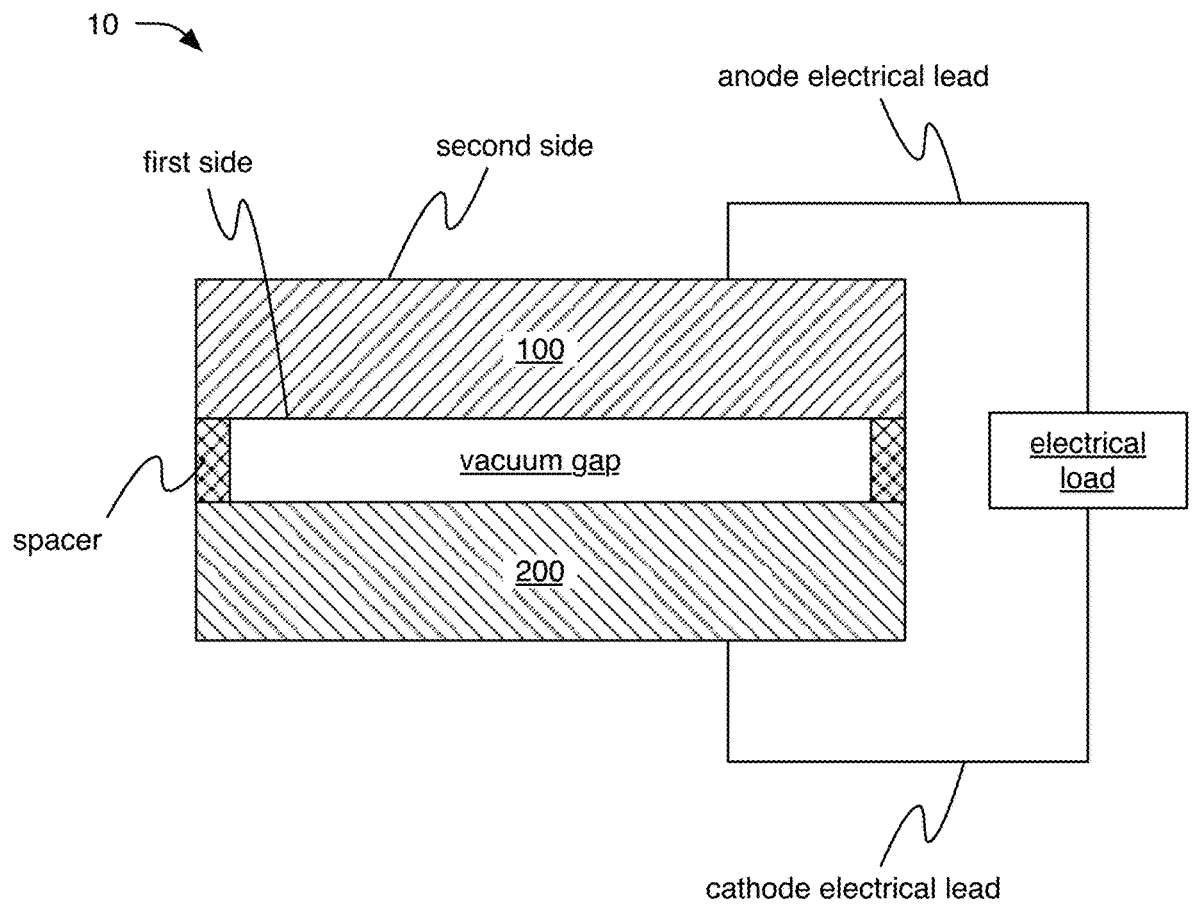
FIG. 1 is a cross-sectional view of an embodiment of the system.

A thermionic energy conversion system 10 (TEC) preferably includes an anode 100 and a cathode 200 (e.g., as shown in FIG. 1). However, the system 10 can additionally or alternatively include any other suitable elements.

The anode 100, cathode 200, and/or other elements of the system can include (e.g., be made of) any suitable materials and/or combinations of materials. The materials can include semiconductors, metals, insulators, 2D materials (e.g., 2D topological materials, single layer materials, etc.), organic compounds (e.g., polymers, small organic molecules, etc.), and/or any other suitable material types.

The semiconductors can include group IV semiconductors, such as Si, Ge, SiC, and/or alloys thereof; III-V semiconductors, such as GaAs, GaSb, GaP, GaN, AlSb, AlAs, AlP, AlN, InSb, InAs, InP, InN, and/or alloys thereof; II-VI semiconductors, such as ZnTe, ZnSe, ZnS, ZnO, CdSe, CdTe, CdS, MgSe, MgTe, MgS, and/or alloys thereof; and/or any other suitable semiconductors. The semiconductors can be doped and/or intrinsic. Doped semiconductors are preferably doped by low-diffusivity dopants, which can minimize dopant migration (e.g., at elevated temperatures). For example, n-type Si is preferably doped by P and/or Sb, but can additionally or alternatively be doped by As and/or any other suitable dopant, and p-type Si is preferably doped by In, but can additionally or alternatively be doped by Ga, Al, B, and/or any other suitable dopant. The semiconductors can be single-crystalline, poly-crystalline, micro-crystalline, amorphous, and/or have any other suitable crystallinity or mixture thereof (e.g., including micro-crystalline regions surrounded by amorphous regions).

The metals can include alkali metals (e.g., Li, Na, K, Rb, Ce, Fr), alkaline earth metals (e.g., Be, Mg, Ca, Sr, Ba, Ra), transition metals (e.g., Sc, Ti, V, Cr, Mn, Fe, Co, Ni, Cu, Zn, Sn, Zr, Nb, Mo, Au, Ru, Rh, Pd, Ag, Cd, Hf, Ta, W, Re, Ir, Pt, Hg, Ga, Tl, Pb, Bi, Sb, Te, Sm, Tb, Ce, Nd), post-transition metals (e.g., Al, Zn, Ga, Ge, Cd, In, Sn, Sb, Hg, Tl, Pb, Bi, Po, At), metalloids (e.g., B, As, Sb, Te, Po), rare earth elements (e.g., lanthanides, actinides), synthetic elements (e.g., Am, Cm, Bk, Cf, Es, Fm, Md, No, Lr, Rf, Db, Sg, Bh, Hs, Mt, Ds, Rg, Cn, Nh, Fl, Mc, Lv, Ts), any other suitable metal elements, and/or any suitable alloys, compounds, and/or other mixtures of the metal elements.

The insulators can include any suitable insulating (and/or wide-bandgap semiconducting) materials. For example, insulators can include insulating metal and/or semiconductor compounds, such as oxides, nitrides, carbides, oxynitrides, fluorides, borides, and/or any other suitable compounds.

The 2D materials can include any suitable 2D materials. For example, the 2D materials can include graphene, BN, metal dichalcogenides (e.g., $MoS_2$, $MoSe_2$, etc.), and/or any other suitable materials. However, the system can include any other suitable materials.

The elements of the system can include any suitable alloys, compounds, and/or other mixtures of materials (e.g., the materials described above, other suitable materials, etc.), in any suitable arrangements (e.g.; multilayers; superlattices; having microstructural elements such as inclusions, dendrites, lamina, etc.).

1.1 Anode

Figure 2A:
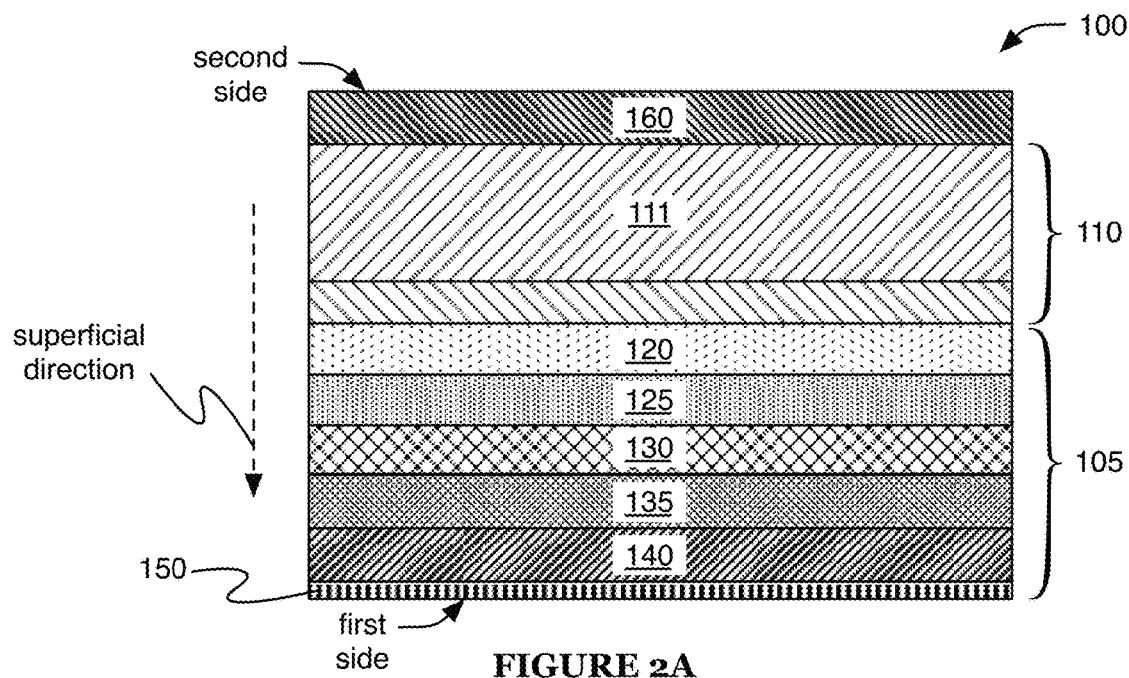
FIGS. 2A-2C are cross-sectional views of a first, second, and third example, respectively, of an anode of the system.
Figure 2B:
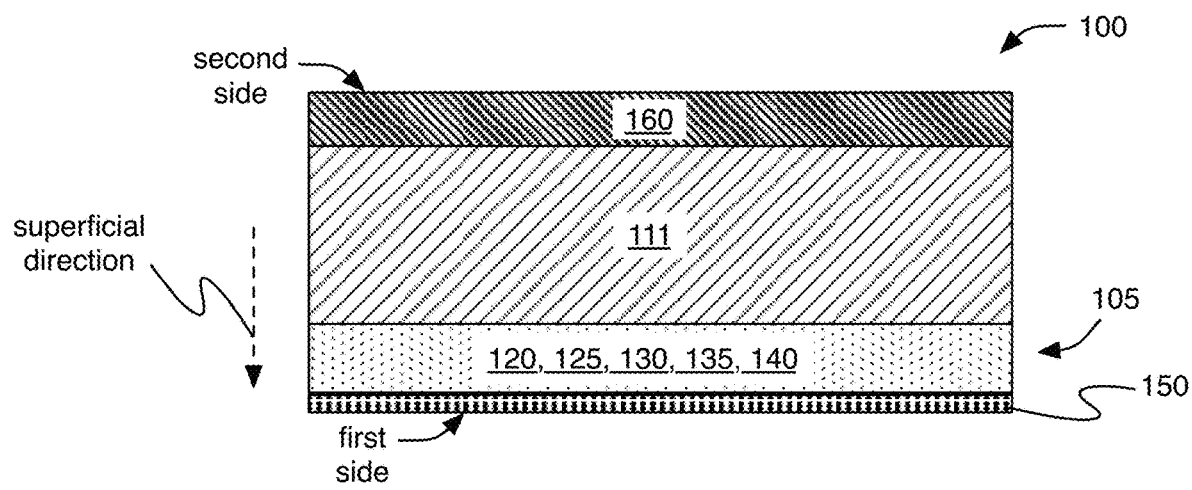
Figure 2C:
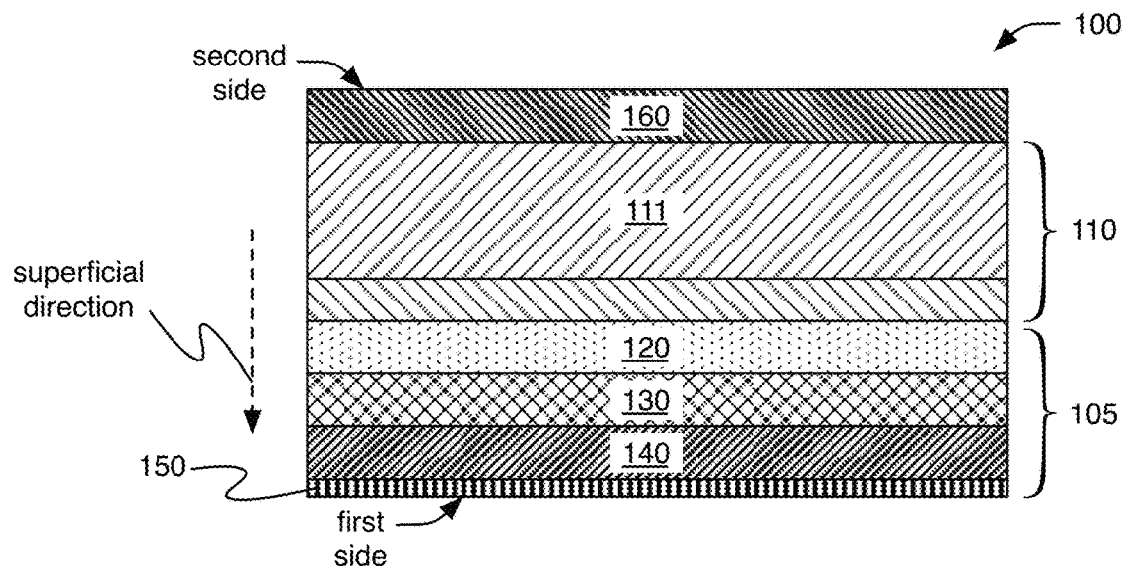

The anode 100 functions to collect thermionically emitted electrons (e.g., emitted from the cathode 200). The anode 100 preferably includes one or more semiconductor layers 110, and can optionally include one or more supplemental layers 105 (e.g., electronic protection layers 120, electronic population control layers 125, electron capture layers 130, optical tuning layers 135, chemical protection layers 140, work function tuning layers 150, etc.), electrical contacts 160, and/or any other suitable elements (e.g., as shown in FIGS. 2A-2C).

The anode 100 is preferably substantially planar (e.g., is a flat wafer), but can additionally or alternatively define any suitable shape. Each layer of the anode is preferably a continuous thin film (or multilayer of thin films). However, one or more of the layers can additionally or alternatively be discontinuous, patterned (e.g., laterally), textured, have varying composition (e.g., laterally), and/or have any other suitable conformation. The anode 100 can optionally include surface textures (and/or inter-layer textures, such as between adjacent layers), lateral features, and/or any other suitable features. The layers of the anode 100 preferably define substantially sharp interfaces (e.g., wherein an interfacial region between the layers is limited to substantially as thin as practical, such as 0, 1-3, 3-10, 10-30, or 30-100 atomic layers and/or 0-0.3, 0.3-1, 1-3, 3-10, 10-30, or greater than 30 nm), but can additionally or alternatively include substantial (e.g., defining a thickness such as less than 1, 1-3, 3-10, 10-30, 30-100, or 100-300 nm) interfacial regions (e.g., including regions of mixed and/or non-uniform composition, composition gradients between the layers, etc.) and/or include any other suitable interface. The interfacial regions can be defined between layers, can penetrate through all or substantially all of one or more layers, and/or have any other suitable arrangement.

The anode 100 preferably includes a first side and a second side opposing the first side (e.g., opposing broad faces of a wafer). The anode 100 preferably defines a superficial-deep axis from the first side to the anode interior between the first and second sides (e.g., toward the second side). Elements superficial (e.g., along the superficial-deep axis) to the semiconductor layers 110, such as the electronic protection layers 120, electron capture layers 130, chemical protection layers 140, work function tuning layers 150, electrical contacts 160, etc.) preferably transmit light (e.g., photons with energy greater than the bandgap of one or more of the semiconductors, such as the bulk semiconductor 111). The elements can transmit some, all, or substantially all of the light, or can alternatively reflect and/or absorb all or substantially all incident light. However, the anode 100 can include any other suitable elements in any suitable arrangement.

1.1.1 Semiconductor Layers

Figure 2D:
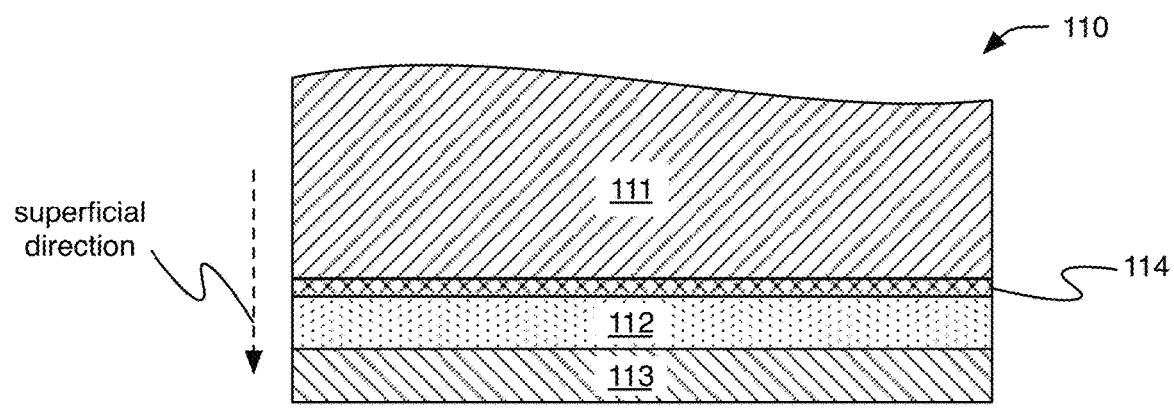
FIG. 2D is a cross-sectional view of an example of semiconductor layers of the anode.

The anode 100 preferably includes one or more semiconductor layers 110, which can function (e.g., in cooperation with other elements of the anode) to enable photovoltage-based work function control (e.g., work function reduction). In some embodiments, the semiconductor layers 110 (and/or other anode elements) are engineered to achieve a large built-in voltage (e.g., to maximize the built-in voltage), which can result in greater photovoltage-based work function reduction. The semiconductor layers 110 preferably include a bulk semiconductor 111, and can optionally include one or more additional semiconductor layers (e.g., reduced-doping layer 112, opposite-type layer 113, carrier blocking layer 114, etc.), such as shown in FIG. 2D. Such additional semiconductor layers can function, for example, to increase the built-in voltage of the anode (e.g., thereby enhancing the potential photovoltage effect, which can result in greater work function reduction), to reduce undesired carrier recombination, to tune anode optical properties (e.g., increasing above-gap light absorption in the semiconductor near the first side, reducing above-gap light absorption in the semiconductor near the second side and/or in non-semiconductor regions of the anode, reducing below-gap light absorption, etc.), and/or perform any other suitable functions.

The semiconductor layers 110 are preferably arranged adjacent each other, and the additional semiconductor layers are preferably arranged superficial of the bulk semiconductor 111 (e.g., along the superficial-deep axis). Adjacent semiconductor layers can form semiconductor junctions, which can include homojunctions and/or heterojunctions, isotype junctions (e.g., n-n$^+$, n-N) and/or heterotype junctions (e.g., p-n, p-i-n, P-n, etc.), and/or any other suitable junction types. Adjacent semiconductor layers 110 preferably form high-quality interfaces (e.g., having few electronic defects) with the adjacent semiconductor layer(s). For example, the semiconductor layers 110 can be epitaxial. Alternatively, some or all of the semiconductor layers and/or interfaces can include moderate and/or high densities of electronic defects (e.g., to achieve Fermi-level pinning at a desired energy level), and/or include any other suitable interface aspects. Each additional semiconductor layer can have a thickness less than and/or greater than a threshold maximum and/or minimum thickness (e.g., 1 mm, 100 µm, 10 µm, 1 µm, 100 nm, 10 nm, 1 nm, 0.1 nm, 0.1-1 nm, 1-10 nm, 10-100 nm, 100-1000 nm, 1-10 µm, several monolayers, monolayer, sub-monolayer, etc.), or can have any other suitable thickness. The anode 100 can include any suitable number and variety of semiconductor layers 110 in any suitable arrangement.

The bulk semiconductor 111 is preferably a high-quality (e.g., single-crystalline, low-impurity, etc.) semiconductor, but can additionally or alternatively include semiconductor materials of any suitable quality. The bulk semiconductor 111 is preferably Si, gallium arsenide (e.g., GaAs), aluminum gallium arsenide (e.g., $Al_xGa_{1-x}As$), gallium indium phosphide (e.g., $Ga_xIn_{1-x}P$), or aluminum gallium indium phosphide (e.g., $Al_xGa_yIn_{1-x-y}P$), but can additionally or alternatively include any suitable semiconductor materials (e.g., as described above).

The bulk semiconductor 111 is preferably an n-type semiconductor (e.g., so that a photovoltage effect caused by illumination of the bulk semiconductor will reduce the anode work function). However, the bulk semiconductor 111 can additionally or alternatively include p-type semiconductor material, intrinsic semiconductor material, and/or any other suitable doping(s). The bulk semiconductor 111 is preferably highly doped (e.g., equilibrium charge carrier density greater than a threshold level such as $10^{15}/cm^3$, $10^{16}/cm^3$, $10^{17}/cm^3$, $10^{18}/cm^3$, $10^{19}/cm^3$, $10^{20}/cm^3$ etc.; equilibrium carrier density in the range $10^{15}/cm^3$-$10^{16}/cm^3$, in the range $10^{16}/cm^3$-$10^{17}/cm^3$, in the range $10^{17}/cm^3$-$10^{18}/cm^3$, in the range $10^{18}/cm^3$-$10^{15}/cm^3$, etc.), but can additionally or alternatively include lower doping (e.g., equilibrium carrier density less than $10^{15}/cm^3$, less than $10^{14}/cm^3$, less than $10^{12}/cm^3$, in the range $10^{14}/cm^3$-$10^{15}/cm^3$, in the range $10^{12}/cm^3$-$10^{14}/cm^3$, etc.), which may be desirable, for example, to reduce free carrier absorption, and/or any other suitable doping level. In a specific example, the bulk semiconductor 111 has an equilibrium carrier density in the range $10^{16}/cm^3$-$3$-$10^{17}/cm^3$ (e.g., $1$-$3 \times 10^{16}/cm^3$, $3$-$6 \times 10^{16}/cm^3$, $6$-$10 \times 10^{16}/cm^3$, $1$-$3 \times 10^{17}/cm^3$, $7.5 \times 10^{16}/cm^3$-$2 \times 10^{17}/cm^3$, etc.). The bulk semiconductor 111 preferably has substantially uniform doping, but can additionally or alternatively include doping changes (e.g., changing laterally and/or with depth) such as gradients, discontinuities, and/or any other suitable doping features.

The bulk semiconductor 111 is preferably wafer-thick (e.g., 150 µm-1 mm, 50-150 µm, 1-3 mm, etc.), more preferably having a thickness in the range 50-250 µm (e.g., 50 µm, 100 µm, 125 µm, 150 µm, 175 µm, 200 µm, 250 µm, etc.), but can alternatively be thicker (e.g., many mm thick slab, greater than 1 cm thick, etc.), thinner (e.g., less than 50 µm, such as a thin film or multilayer), or have any other suitable thickness. In some examples, the bulk semiconductor 111 is thicker than the than its hole diffusion length (e.g., greater in thickness by a factor such as 1.1, 1.2, 1.5, 2, 3, 5, 10, 20, 30, 50, 100, 1.01-1.1, 1.1-1.3, 1.3-1.5, 1.5-2, 2-3, 3-5, 5-10, 10-30, 30-100, etc.), which can function, for example, to reduce Fermi level splitting at the back side of the semiconductor (e.g., side proximal the anode second side), which can otherwise reduce the device output voltage. Additionally or alternatively, a thinner bulk semiconductor may be desirable, for example, to reduce free carrier absorption, which can otherwise contribute to parasitic heat transfer (e.g., from the cathode to the anode). The bulk semiconductor 111 preferably functions as a mechanical support for the anode 100 (e.g., supports the anode weight during handling and/or operation), but the anode 100 can additionally or alternatively include one or more mechanical support structures (e.g., substrate, ribs, etc.). For example, the anode 100 can include a semiconductor-on-insulator substrate (e.g., silicon-silica-silicon substrate). Although described as a bulk semiconductor, a person skilled in the art will recognize that a semiconductor of any suitable thickness (and/or other dimensions) can be used in the anode as the bulk semiconductor 111.

The reduced-doping layer 112 is preferably doped the same type (e.g., n-type, p-type) as the bulk semiconductor 111, with a lower equilibrium carrier density than the bulk semiconductor 111. The reduced-doping layer 112 can additionally or alternatively include one or more intrinsic or minimally doped layers. The reduced-doping layer 112 is preferably made of the same material as the bulk semiconductor 111 (e.g., forming an isotype homojunction with the bulk semiconductor 111), but can additionally or alternatively include different semiconductor material(s) than the bulk semiconductor 111 (e.g., forming an isotype heterojunction with the bulk semiconductor 111). For example, in an anode 100 with a highly-doped (e.g., equilibrium carrier concentration greater than $10^{18}/cm^3$) n-Si bulk semiconductor 111, the reduced-doping layer 112 can be n-Si with a lower doping level (e.g., equilibrium carrier density less that of the bulk semiconductor 111, less than a threshold value such as $10^{16}/cm^3$, etc.).

The reduced-doping layer 112 is preferably arranged adjacent to and superficial of (e.g., grown epitaxially from) the bulk semiconductor 111 or carrier blocking layer 114, but can additionally or alternatively have any other suitable arrangement. The reduced-doping layer 112 can have a thickness in the range 100 nm-100 µm (e.g., 1-10 µm, 100-10000 nm, 300-3000 nm, 500-1500 nm, etc.), less than 100 nm (e.g., 10-30 nm, 25-65 nm, 60-100 nm, less than 10 nm, etc.), greater than 100 µm, and/or any other suitable thickness. The layer thickness is can be comparable to the carrier (e.g., electron and/or hole) diffusion length of the layer, substantially greater than the carrier diffusion length, or substantially less than the carrier diffusion length. In some embodiments, a lower thickness can be desirable for the reduced-doping layer 112, especially at lower doping levels (e.g., to reduce electrical resistance of the layer). However, the reduced-doping layer 112 can include any suitable material of any suitable thickness in any suitable arrangement.

The opposite-type layer 113 is preferably doped the opposite type as the bulk semiconductor 111 (e.g., p-type doping in an anode 100 with an n-type bulk semiconductor 111). The opposite-type layer 113 can be highly doped (e.g., equilibrium carrier density greater than a threshold level such as $10^{18}/cm^3$, $10^{19}/cm^3$, $10^{20}/cm^3$, $10^{17}/cm^3$, $10^{16}/cm^3$, etc.), moderately or lightly doped (e.g., equilibrium carrier density less than $10^{16}/cm^3$, less than $10^{14}/cm^3$, less than $10^{12}/cm^3$, in the range $10^{14}/cm^3$-$10^{16}/cm^3$, in the range $10^{12}/cm^3$-$10^{14}/cm^3$, etc.) and/or have any other suitable doping level.

The opposite-type layer 113 is preferably arranged adjacent to and superficial of (e.g., grown epitaxially from) the carrier blocking layer 114, reduced-doping layer 112, or bulk semiconductor 111, but can additionally or alternatively have any other suitable arrangement. The opposite-type layer 113 is preferably made of the same material as the bulk semiconductor 111 and/or reduced-doping layer 112 (e.g., forming a p-n homojunction with the adjacent semiconductor layer), but can additionally or alternatively include different semiconductor material(s) (e.g., forming a p-n heterojunction with the adjacent semiconductor layer). For example, a p-type Si opposite-type layer 113 can form a p-n junction with an adjacent n-type Si bulk semiconductor 111.

The opposite-type layer 113 can have a thickness in the range 100 nm-100 µm (e.g., 1-10 µm, 100-1000 nm, 300-3000 nm, 500-1500 nm, etc.), less than 100 nm (e.g., 10-30 nm, 25-65 nm, 60-100 nm, less than 10 nm, etc.), greater than 100 µm, and/or any other suitable thickness. The layer thickness can be comparable to the carrier (e.g., electron and/or hole) diffusion length of the layer, substantially greater than the carrier diffusion length, or substantially less than the carrier diffusion length. In some embodiments, a lower thickness can be desirable for the reduced-doping layer 112, especially at lower doping levels (e.g., to reduce electrical resistance of the layer). However, the opposite-type layer 113 can include any suitable material of any suitable thickness in any suitable arrangement.

The carrier blocking layer 114 can function to block (e.g., prevent, impede, reduce, etc.) charge carrier transmission (e.g., through the carrier blocking layer 114 along the superficial-deep axis). The carrier blocking layer 114, cooperatively with one or more adjacent semiconductor layers 110 and/or other layers, can form a junction that defines a significant energy barrier (e.g., substantially greater than $k_BT$ at a typical anode operation temperature, such as 250-350° C.) in one band edge (e.g., valence band edge, conduction band edge), and preferably defines no more than a minimal energy barrier in the other band edge. The carrier blocking layer 114 is preferably a hole blocking layer (e.g., defining a large valence band offset and a minimal conduction band offset), but can additionally or alternatively be an electron blocking layer and/or any other suitable carrier blocking layer.

The carrier blocking layer 114 is preferably highly doped (e.g., equilibrium carrier density greater than a threshold level such as $10^{18}/cm^3$, $10^{19}/cm^3$, $10^{20}/cm^3$, $10^{17}/cm^3$, $10^{16}/cm^3$, etc.), but can additionally or alternatively include lower doping (e.g., equilibrium carrier density less than $10^{16}/cm^3$, less than $10^{14}/cm^3$, less than $10^{12}/cm^3$, in the range $10^{14}/cm^3$-$10^{6}/cm^3$, in the range $10^{12}/cm^3$-$10^{14}/cm^3$, etc.) and/or any other suitable doping level.

The carrier blocking layer 114 is preferably arranged adjacent to and superficial of (e.g., grown epitaxially from) the bulk semiconductor 111, but can additionally or alternatively have any other suitable arrangement. The carrier blocking layer 114 is preferably made of a different material (or materials) than the bulk semiconductor 111, reduced-doping layer 112, and/or other adjacent semiconductor layers (e.g., forming a heterojunction with the adjacent semiconductor layer), but can additionally or alternatively include the same semiconductor material.

Additionally or alternatively, the anode can include a carrier blocking layer 114 arranged between the bulk semiconductor 111 and the electrical contact 160 (e.g., adjacent to the bulk semiconductor 111 and/or any other suitable semiconductor layer, proximal the second side of the anode). In this arrangement, the carrier blocking layer 114 can function to impose a back surface field (e.g., preventing charge carriers of one type, preferably holes, from reaching the electrical contact 160). This back surface field carrier blocking layer is preferably made of the same material as the bulk semiconductor 111 and/or other adjacent semiconductor layers, but can additionally or alternatively include any other suitable materials. The back surface field carrier blocking layer preferably exhibits higher doping than the bulk semiconductor. For example, the back surface field carrier blocking layer can be formed by implanting additional dopants (e.g., n-type dopants) into the bulk semiconductor 111 along its rear surface (e.g., proximal the second side of the anode).

The carrier blocking layer 114 can have a thickness in the range 1-200 nm (e.g., 5-50 nm), 200 nm-1 μm, less than 1 nm, greater than 1 μm, and/or any other suitable thickness. The carrier blocking layer 114 is preferably sufficiently thick to block carrier tunneling through the energy barrier. For example, the carrier blocking layer 114 thickness can be greater than a threshold thickness (e.g., 1 nm, 3 nm, 5 nm, 10 nm, etc.). However, the carrier blocking layer 114 can include any suitable material of any suitable thickness in any suitable arrangement.

In a first variation, the semiconductor layers 110 include a highly-doped n-type bulk semiconductor 111 and a reduced-doping layer 112, which cooperatively define an n-n+ homojunction. In a second variation, the semiconductor layers 110 include an n-type bulk semiconductor 111, a minimally-doped reduced-doping layer 112 (e.g., having only unintentional doping), and an opposite-type layer 113, which cooperatively define a p-i-n homojunction. In a third variation, the semiconductor layers 110 include, in order of decreasing depth: a highly-doped n-type GaAs bulk semiconductor 111, an n-type carrier blocking layer 114 of a III-V semiconductor other than GaAs (preferably gallium indium phosphide, but alternatively aluminum gallium arsenide, aluminum gallium indium phosphide, or any other suitable III-V semiconductor), an n-type GaAs layer with doping substantially equal to the bulk semiconductor 111, and an n-type GaAs reduced-doping layer 112. However, the semiconductor layers 110 can additionally or alternatively include any other suitable layers in any suitable arrangement.

1.1.2 Supplemental Anode Layers

In addition to (or in place of) the semiconductor layer(s) 110, the anode can optionally include one or more supplemental layers 105, such as layers that function as one or more of: electronic protection layers 120, electronic population control layers 125, electron capture layers 130, optical tuning layers 135, chemical protection layers 140, work function tuning layers 150, and/or any other suitable layers. The anode can include a single supplemental layer (e.g., which provides one or more than one of the functionalities described herein regarding the supplemental layers), multiple supplemental layers, or no supplemental layer.

The electronic protection layer 120 can function to passivate (e.g., minimize electronic traps at and/or near) one or more semiconductor surfaces and/or interfaces (e.g., most superficial semiconductor interface of the anode). However, the electronic protection layer 120 can additionally or alternatively function to include moderate and/or high densities of electronic defects (e.g., to achieve Fermi-level pinning at a desired energy level) in any suitable locations, and/or to control any other suitable interface aspects. The electronic protection layer 120 is preferably adjacent to, and more preferably superficial of, the semiconductor layer(s) 110 that it protects.

The electronic protection layer 120 preferably allows efficient electron transport through itself (e.g., from superficial toward deep). For example, the electronic protection layer 120 can be sufficiently thin to enable efficient tunneling through it (e.g., less than a threshold thickness, such as 1, 3, or 5 nm), and/or can have a conduction band edge that enables electrons to travel through it (e.g., substantially aligned with the conduction band edges of adjacent layers; conduction band edges of the electronic protection layer 120 and adjacent layers staggered or sloped, such as with decreasing energy at increasing depth in the anode; etc.). The electronic protection layer 120 can additionally or alternatively block (e.g., prevent, reduce, etc.) hole transport through itself (e.g., can function as a carrier blocking layer 114). For example, the electronic protection layer valence band edge can define a large offset from one or more of the adjacent layers (e.g., presenting a large energetic barrier to holes entering and/or exiting the layer).

The electronic protection layer 120 can have a thickness less than a threshold thickness (e.g., 10 nm, 100 nm, 1 μm, etc.). For example, the thickness can be 1-10 nm, 10-25 nm, 25-100 nm, or less than 1 nm. However, the electronic protection layer 120 can alternatively have a thickness greater than 1 μm, or have any other suitable thickness.

The electronic protection layer 120 preferably includes (e.g., is preferably made of) an insulator or semiconductor (e.g., having a wider bandgap than one or more of the materials in the semiconductor layers 110). In a first variation, the electronic protection layer 120 includes a semiconductor-based compound. The compound can include the same material as the semiconductor layers 110, and/or can include one or more other semiconductors. In a first example of this variation, the electronic protection layer 120 includes a semiconductor-oxide compound (e.g., a native oxide or thermal oxide, such as silicon oxide grown from an underlying silicon layer; residual portions of a native oxide, such as after partial removal of the oxide under treatment such as thermal and/or chemical treatment; etc.). In a specific example, the electronic protection layer 120 includes (e.g., substantially is) a silicon oxide layer with thickness less than 10 nm (e.g., 0.05-0.5 nm, 0.25-1 nm, 0.5-3 nm, 2-5 nm, 3.5-7 nm, 5-10 nm, etc.). In a second example, the electronic protection layer 120 includes a semiconductor-nitride and/or—oxynitride compound (e.g., silicon nitride).

In a second variation, the electronic protection layer 120 includes a metal compound. The compound is preferably a transition metal (e.g., titanium, tantalum, molybdenum, hafnium, lanthanum, etc.) compound, but can additionally or alternatively include any other suitable metal elements. In a first example of this variation, the compound is an oxide (e.g., titanium oxide, tantalum oxide, molybdenum oxide, etc.), nitride, or oxynitride. In a second example, the compound is a silicide (e.g., nickel silicide).

In a third variation, the electronic protection layer 120 includes a wide bandgap semiconductor (e.g., GaN). In a fourth variation, the electronic protection layer 120 includes a 2D material (e.g., graphene, BN, $MoS_2$, $MoSe_2$, etc.). However, the electronic protection layer 120 can additionally or alternatively include any other suitable materials.

The electronic population control layer 125 can function to affect the electron and/or hole population (e.g., concentration, energy levels, etc.) within the semiconductor layers 110 (e.g., at and/or near the superficial side of the semiconductor layers). The layer 125 preferably functions to increase the built-in voltage of the anode (e.g., thereby enhancing the potential photovoltage effect, which can result in greater work function reduction), but can additionally or alternatively perform any other suitable functions.

In a first embodiment, the electronic population control layer 125 is also an electronic protection layer 120, such as a layer arranged near (e.g., just superficial of) the superficial side of the semiconductor layers. In a second embodiment, the electronic population control layer 125 is arranged near (e.g., just superficial of) the superficial side of the electronic protection layer 120 (e.g., wherein the electronic protection layer 120 is arranged adjacent the superficial side of the semiconductor layers 110). However, the electronic population control layer 125 can alternatively have any other suitable arrangement.

The electronic population control layer 125 preferably causes the Fermi level to lie (e.g., due to Fermi level pinning) near the semiconductor valence band edge (e.g., within a threshold energetic distance of the valence band, such as 10, 20, 50, 75, 100, 150, 200, 250, 300, 400, 500, 5-25, 20-50, 40-100, 75-200, 150-350, or 300-500 meV; within a fractional amount of the semiconductor bandgap, such as 0.5%, 1%, 2%, 3%, 5%, 7.5%, 10%, 15%, 20%, 25%, 30%, 40%, 0.5-2.5%, 2-5%, 4-10%, 7.5-20%, or 15-40%; etc.). However, the layer 125 can additionally or alternatively cause the Fermi level to lie near (e.g., within the threshold energetic distance or fractional amount of the semiconductor) the conduction band edge, the mid-gap energy level, and/or any other suitable energy level of the semiconductor and/or any other suitable material of the anode.

The layer 125 can affect the electron population via electronic defects and/or charge neutrality level at a desired energy level (e.g., energy level of desired Fermi level pinning, such as at or near the semiconductor valence band edge). The electronic defects are preferably arranged near the superficial side of the layer 125 (e.g., thereby reducing likelihood of charge carriers within the semiconductor recombining at the defects), but can additionally or alternatively be arranged near the deep side (e.g., at the interface with the semiconductor layers) and/or in the bulk of the layer 125. The charge neutrality level is preferably associated with a low Schottky pinning parameter, but can alternatively be exhibited by a material with any suitable Schottky pinning parameter.

The electronic population control layer 125 can have a thickness less than a threshold thickness (e.g., 10 nm, 100 nm, 1 µm, etc.). For example, the thickness can be 1-10 nm, 10-25 nm, 25-100 nm, or less than 1 nm. However, the electronic protection layer 120 can alternatively have a thickness greater than 1 µm, or have any other suitable thickness.

The electronic population control layer 125 preferably includes (e.g., is made of) a metal and/or metal compound. The metal is preferably a transition metal (e.g., titanium, tantalum, molybdenum, hafnium, lanthanum, etc.), but can additionally or alternatively include any other suitable metal elements. In a first example of this variation, the compound is an oxide (e.g., titanium oxide, tantalum oxide, molybdenum oxide, etc.), nitride, or oxynitride. In a second example, the compound is a silicide (e.g., nickel silicide). In a third example, the material is metallic (e.g., titanium metal, molybdenum metal, tungsten metal, iridium metal, etc.). However, the layer 125 can additionally or alternatively include any other suitable materials.

In one example, the layer 125 (e.g., a layer of titanium oxide) is deposited (e.g., onto the semiconductor layers no) by a thin film growth technique such as atomic layer deposition (e.g., thermal ALD, plasma ALD, etc.). Such a deposition technique may result in formation of an additional oxide layer between the semiconductor layers no and the electronic population control layer 125 (e.g., when the semiconductor layers are silicon, a thin silicon oxide layer may form between the silicon and the electronic population control layer 125). In this example, the layer 125 is preferably deposited at a relatively high deposition temperature (e.g., greater than or equal to a threshold temperature, such as 1000, 900, 800, 700, 600, 500, 400, 300, 250, 200, 150, 150-350, 300-500, 400-600, 500-700, 650-850, or 800-1000° C.), which can promote formation of desirable electronic defects. In a specific example, a layer of titanium oxide is deposited by thermal ALD at a temperature of 200-300° C. (e.g., approximately 250° C., such as 225-275, 235-265, or 245-255° C.), preferably using water and one or more titanium precursor species such as tetrakis(dimethylamido)titanium (TDMAT) and/or titanium isopropoxide (TTIP). However, the layer 125 can additionally or alternatively be deposited at a moderate or low temperature (e.g., less than or equal to the threshold temperature) and/or under any other suitable conditions.

The electron capture layer 130 can function to capture electrons (e.g., electrons thermionically emitted from the cathode) and/or to enable captured electron transport deeper into the anode (e.g., to the semiconductor layers 110, such as to the bulk semiconductor 100). The electron capture layer 130 is preferably configured (e.g., the materials and/or configurations are selected) to minimize evaporation, interdiffusion, and/or deleterious interaction (e.g., at a typical elevated anode operation temperature, such as 150-250° C., 250-350° C., 450-550° C., 550-650° C., 100-1000° C., and/or any other suitable anode temperature) with the other layers of the anode (e.g., work function tuning layer 150).

The electron capture layer 130 can have a thickness less than a threshold thickness (e.g., 10 nm, 100 nm, etc.). For example, the thickness can be 1-10 nm, 10-25 nm, 25-100 nm, or less than 1 nm. However, the electronic protection layer 120 can alternatively have a thickness greater than 100 nm, or have any other suitable thickness.

The electron capture layer 130 preferably includes (e.g., is preferably made of) one or more materials that provide a high electron density of states (e.g., in the conduction band and/or close to the vacuum level, such as within 0.05, 0.1, 0.2, 0.3, or 0.5 eV of the vacuum level) and/or a high effective electron mass (e.g., greater than or equal to a threshold multiple of the free electron mass, such as 0.75, 1, 1.1, 1.2, 1.3, 1.4, 1.5, 1.75, 2, 2.5, 0.7-1, 0.9-1.1, 1-1.3, 1.2-1.5, 1.4-1.6, 1.5-1.8, 1.75-2.25, 2-3, etc.), which can function to increase electron capture in the layer.

In a first variation, the electron capture layer 130 includes one or more metals. In a first example of this variation, the layer includes a transition metal (e.g., Ni, W, Mo, etc.). In a second example, the layer includes an alkali or alkaline earth metal (e.g., Cs, Ba, Sr, etc.), which can additionally or alternatively function as a work function tuning layer 150 and/or as a reservoir for a work function tuning layer 150 (e.g., replenishing depleted material from the work function tuning layer 150.

In a second variation, the electron capture layer 130 includes a metal compound. The compound is preferably a transition metal (e.g., titanium, tantalum, molybdenum, hafnium, lanthanum, etc.) compound, but can additionally or alternatively include any other suitable metal elements. In a first example of this variation, the compound is an oxide (e.g., titanium oxide, tantalum oxide, molybdenum oxide, etc.), nitride (e.g., titanium nitride, tantalum nitride, etc.), or oxynitride. In a second example, the compound is a silicide (e.g., nickel silicide).

In a third variation, the electron capture layer 130 includes a 2D material (e.g., graphene, BN, $MoS_2$, $MoSe_2$, etc.). In a fourth variation, the electron capture layer 130 includes a boron compound (e.g., hexaboride such as $LaB_6$, $CeB_6$, $BaB_6$, etc.).

The electron capture layer 130 can include any suitable combinations (e.g., alloys, mixtures, etc.) of the above materials and/or any other suitable materials. In a first specific example, the electron capture layer 130 includes a mixture of titanium nitride and tungsten. In a second specific example, the layer 130 includes a transition metal oxide with $LaB_6$ inclusions. However, the electronic protection layer 120 can additionally or alternatively include any other suitable materials with any other suitable structure.

The optical tuning layer 135 can function to tune the anode's interaction with incident light (e.g., radiation emitted by the cathode, enclosure, spacers, and/or other elements of the TEC, such as thermal radiation; light from external sources, such as sunlight; etc.). For example, the optical tuning layer 135 can function to increase or reduce the amount of light, preferably above-gap light (e.g., photons with energy about the semiconductor bandgap), absorbed by the bulk semiconductor and/or other semiconductor layers (e.g., as compared with absorption in an otherwise substantially identical anode in which the optical tuning layer is different or absent). The optical tuning layer 135 can additionally or alternatively function to reduce the amount of light absorbed by the anode outside the semiconductor layers, reduce the sub-gap light (e.g., photons with energy less than the semiconductor bandgap) absorbed by the anode (e.g., including absorption within the semiconductor layers, such as free-carrier absorption), function to control which regions within the semiconductor light is absorbed in (e.g., promoting absorption near the first side of the anode, reducing absorption near the second side of the anode and/or deep within the bulk semiconductor, etc.), and/or function to tune optical properties of the anode (and/or other elements of the system) in any other suitable manner.

The optical tuning layer 135 is preferably integrated with another supplemental layer 105 (e.g., wherein the other supplemental layer additionally functions as an optical tuning layer). For example, the electronic protection layer 120, electronic population control layer 125, electron capture layer 130, and/or chemical protection layer 140 can function as an optical tuning layer 135. However, the supplemental layers 105 can additionally or alternatively include a separate optical tuning layer 135 (e.g., layer included solely or primarily for optical tuning functionality), the optical tuning layer 135 can be integrated with a semiconductor layer (e.g., wherein a semiconductor layer, such as the carrier blocking layer, additionally functions as an optical tuning layer), and/or the optical tuning can be achieved in any other suitable manner.

The optical tuning layer 135 can have a thickness less than a threshold thickness (e.g., 10 nm, 100 nm, etc.). For example, the thickness can be 1-10 nm, 10-25 nm, 25-100 nm, or less than 1 nm. However, the electronic protection layer 120 can alternatively have a thickness greater than 100 nm, or have any other suitable thickness. The optical tuning layer 135 (and/or any other supplemental layers 105) can have a refractive index greater than 1 (e.g., 1.1, 1.2, 1.3, 1.4, 1.5, 1.75, 2, 2.25, 2.5, 3, 1-1.3, 1.2-1.5, 1.5-2, 2-3, greater than 3, etc.), substantially equal to 1, between 0 and 1, less than 0, and/or any other suitable refractive index. The optical tuning layer 135 can include: metals, metal compounds (e.g., oxides, nitrides, etc.), semiconductors, semiconductor compounds (e.g., oxides, nitrides, etc.), and/or any other suitable materials.

In a first embodiment, the optical tuning layer 135 functions to increase above-gap light absorption in the semiconductor layers (e.g., to enhance the photovoltage effect). In a first example of this embodiment, the layer 135 functions as an anti-reflective coating. In this example, the layer 135 preferably has an intermediate refractive index (e.g., with a value between the indices of the semiconductor layers and the gap adjacent the anode first side), such as a value greater than 1 but less than the semiconductor refractive index. In a second example, the layer 135 includes a textured topography (e.g., pyramidal or inverse pyramidal, domed, etc.), which can function to promote light scattering (e.g., increasing photon path length within the semiconductor material, thereby increasing absorption). In a third example, the layer 135 functions to enhance above-gap light intensity in a region of desired absorption (e.g., near a side of the semiconductor layers closest to the anode first side) and/or decrease light intensity in a region of undesired absorption (e.g., near the opposing side of the semiconductor layers, where above-gap absorption can result in photovoltage effects that reduce the device output voltage), such as via constructive and/or destructive optical interference (e.g., achieved in cooperation with one or more other layers of the anode, such as a reflective electrical contact 160 opposing the layer 135 across the semiconductor layers 110). However, the layer 135 can additionally or alternatively increase above-gap absorption in any other suitable manner.

The optical tuning layer 135 can additionally or alternatively function to reduce light absorption in the anode (e.g., to promote retransmission of the light to the cathode, thereby reducing thermal losses from the cathode and/or heating of the anode), optionally including reduction of above-gap light absorption in the semiconductor layers. For example, the layer 135 can be an optical reflector (e.g., can have a high refractive index, such as a refractive index greater than the semiconductor refractive index). In a first example, the layer 135 includes a metal or metal compound that functions as a broad-spectrum reflector. In a second example, the layer 135 includes (e.g., in the semiconductor layers no, such as integrated with and/or near the carrier blocking layer 114) one or more wider-bandgap (as compared with the bulk semiconductor 111) semiconductor layers, preferably moderately- or highly-doped layers. Such wider-bandgap layers can be reflective to below-gap photons (e.g., IR photons) but substantially transparent to above-gap photons (e.g., visible light photons). However, the anode 100 can additionally or alternatively include any suitable optical tuning layer(s) 135 in any suitable configuration.

The chemical protection layer 140 can function to protect materials in one or more other layers (e.g., deeper than the chemical protection layer 140) from chemical and/or electrochemical degradation. For example, the chemical protection layer 140 can function to protect the semiconductor layers no from chemical degradation due to interaction with a work function tuning material (e.g., material from the work function tuning layer 150) and/or other potentially reactive substances in the environment of the anode (e.g., oxygen), such as degradation at elevated temperature (e.g., a typical anode operation temperature, such as 150-250° C., 250-350° C., 450-550° C., 550-650° C., 100-1000° C., and/or any other suitable anode temperature). In a first example, the layer 140 prevents passage (e.g., diffusion) of the reactive and/or degradative species through the layer 140. In a second example, the layer 140 captures the reactive and/or degradative species (e.g., by chemically reacting with them, such as titanium metal and/or oxygen-poor titanium oxide scavenging oxygen, thereby preventing it from oxidizing the semiconductor layers 110). However, the layer 140 can additionally or alternatively function in any other suitable manner.

The chemical protection layer 140 is preferably present in embodiments of the anode 100 that include incompatible (e.g., at elevated temperature, such as a typical anode operation temperature; at ambient temperature; etc.) semiconductor and work function tuning materials (e.g., GaAs and Cs). However, any suitable chemical protection layer 140 can be used in any suitable embodiment of the anode 100. The chemical protection layer 140 is preferably arranged between one or more layers, but can additionally or alternatively be arranged along the edge of the system 10, a face of the system 10, or be otherwise arranged.

The chemical protection layer 140 is preferably conformal to the underlying layer (e.g., adjacent deeper layer), and preferably includes no or minimal structural defects (e.g., pinholes, voids, cracks, etc.), which can enable the layer 140 to function as an effective chemical barrier (e.g., preventing Cs transport through the layer). The layer 140 preferably withstands repeated (e.g., 1-5 cycles per day for 5-50 years) thermal cycling (e.g., between an ambient temperature such as 20° C. and an anode operation temperature such as 150-250° C., 250-350° C., 450-550° C., 550-650° C., 100-1000° C., and/or any other suitable anode temperature) with minimal damage (e.g., minimal development of structural defects). However, the chemical protection layer 140 can have any suitable structural and/or mechanical properties.

The chemical protection layer 140 can have a thickness in the range 0.1-10 nm, greater than 10 nm, or less than 0.1 nm. In some embodiments, a thinner chemical protection layer 140 can reduce layer interactions with electrons (e.g., enabling efficient electron transmission). In other embodiments, a thicker chemical protection layer 140 can provide a more effective chemical barrier (e.g., minimizing damage to underlying layers from reactive work function tuning materials). However, the chemical protection layer 140 can have any suitable thickness.

The chemical protection layer 140 can include (e.g., be made of) insulators (e.g., similar materials as described above regarding the electronic protection layer 120, different materials from the electronic protection layer 120), semiconductors (e.g., the same materials as in the semiconductor layers 110, different semiconductor materials), metals (e.g., transition metals, such as Ni, Mo, W, etc.), and/or any other suitable materials. However, the chemical protection layer 140 can include any other suitable materials with any other suitable structure.

The work function tuning layer 150 can function to alter the anode work function (e.g., in addition to and/or in place of photovoltage-based work function changes), preferably to reduce the work function (e.g., wherein the work function tuning layer 150 is a work function reduction layer) but alternatively to increase the work function. The work function tuning layer 150 is preferably very thin (e.g., monolayer, few monolayers, sub-monolayer, etc.), but can alternatively be thicker. For example, the layer 150 can be less than 1 nm, less than 10 nm, greater than 10 nm, and/or have any other suitable thickness. The work function tuning layer 150 is preferably arranged at (and/or near) the superficial surface of the anode, but can additionally or alternatively have any other suitable arrangement.

In a first embodiment, the work function tuning layer 150 defines one or more substantially sharp interfaces (e.g., wherein an interfacial region between the work function tuning layer 150 and an adjacent layer is limited to substantially as thin as practical, such as described above; wherein the work function tuning layer 150 does not substantially penetrate the adjacent layer, such as by diffusion into the adjacent layer). In a second embodiment, the work function tuning layer 150 forms a substantial interfacial region (e.g., as described above) with one or more adjacent layers. In one example, cesium (and optionally oxygen) is deposited onto a supplemental layer 105 (e.g., titanium oxide supplemental layer) to form a work function tuning layer 150. In this example, some of the cesium (and/or oxygen) may penetrate the supplemental layer 105, creating an interfacial region (e.g., gradient of cesium concentration within the titanium oxide). However, the work function tuning layer 150 can additionally or alternatively define any other suitable interfaces.

The work function tuning (e.g., reduction) effects achieved by the work function tuning layer 150 are preferably independent (or substantially independent) of any photovoltage-based work function tuning effects. For example, the total change in work function between an unilluminated anode with no work function tuning layer and an illuminated anode with a work function tuning layer is preferably substantially equal (e.g., within a threshold value, such as 10, 50, 100, 150, 200, or 300 meV; within a threshold fraction of the work function or change in work function, such as 1%, 2%, 5%, 10%, 15%, 20%, 25%, 30%, etc.) to the sum of the change attributable to the work function tuning layer alone (e.g., for an unilluminated anode) and the photovoltage-based effect alone (e.g., for an anode with no work function tuning layer). However, the work function tuning effects can alternatively not be substantially independent, and/or can have any other suitable relationship.

The work function tuning layer 150 can include (e.g., be made of) any suitable work function tuning materials. In a first variation, the layer 150 includes one or more metals. In a first example of this variation, the metals include alkali or alkaline earth metals (e.g., Cs, Ba, Sr, Ca, etc.). In a second example, the metals include one or more rare earth elements (e.g., La, Ce, etc.). In a second variation, the layer 150 includes a 2D material (e.g., graphene, BN, $MoS_2$, $MoSe_2$, etc.).

In a third variation, the work function tuning layer 150 includes one or more metal compounds (e.g., compounds containing oxygen, fluorine, and/or boron). In a first example of this variation, the compounds include oxides of alkali or alkaline earth metals (e.g., Cs—O). In a second example, the compounds include diboride and/or hexaboride compounds (e.g., $LaB_6$, $CeB_6$, $BaB_6$, etc.). The diboride and/or hexaboride compounds can be stoichiometric, boron-rich, and/or boron-poor. For example, the layer 150 can include an $LaB_6$—$BaB_6$ superlattice, and/or the layer 150 can include inclusions of La, Zr, V, B, and/or compounds thereof.

In one embodiment, the work function tuning layer 150 can include a thin Cs or Cs—O coating formed from a Cs vapor environment adjacent to the anode surface (e.g., first surface). In one example of this embodiment, the supplemental layers include (e.g., at the superficial surface of the anode, superficial to all other layers except the work function tuning layer, etc.) one or more materials on which Cs (and/or other work function reducing materials) exhibits Stranski-Krastanov growth (e.g., layer-plus-island growth, such as growth in which a uniform layer of polarized Cs grows on the surface, followed by and/or along with islands of greater Cs growth), such as titanium oxide and/or other suitable oxides. Such Stranski-Krastanov Cs growth can function to help avoid large-scale depolarization of the Cs layer (e.g., in the presence of excess Cs, such as significantly more Cs than is needed to form the polarized layer), thereby allowing for a large window of Cs conditions in which the majority of the anode surface maintains a significantly decreased work function (e.g., wherein only regions associated with the additional islands of Cs exhibit substantial hampering of the work function reduction effects of Cs). However, the material(s) of the work function tuning layer (e.g., Cs) can additionally or alternatively exhibit island growth, layer growth, and/or any other suitable growth mechanism (e.g., the layer superficial to all other layers except the work function tuning layer can support such growth of the material). However, the work function tuning layer 150 can additionally or alternatively include any suitable material.

The supplemental layers can optionally include (e.g., in addition to and/or in place of a superficial coating such as Cs) a layer of high work function material that functions as a work function tuning layer 150. The layer is preferably very thin (e.g., monolayer, few monolayers, sub-monolayer, 0.1 nm, 0.5 nm, 1 nm, 2 nm, 5 nm, 0.1-0.5 nm, 0.5-2 nm, 2-5 nm, etc.), but can alternatively be thicker (e.g., 5-10 nm, 10-20 nm, 20-50 nm, greater than 50 nm, etc.). The layer can include (e.g., be made of) a metal oxide, such as molybdenum oxide, manganese oxide, tungsten oxide, an oxide of manganese and one or more other metals; a metal (e.g., Ir, Au, Rh, Os, Re, Ru, Ti, Mo, W, Cr, etc.); and/or any other suitable high work function materials (e.g., material with work function in excess of a threshold value, such as 2, 3, 3.5, 4, 4.25, 4.5, 4.6, 4.7, 4.8, 4.9, 5, 5.1, 5.2, 5.3, 5.4, 5.5, 5.6, 5.7, 5.8, 5.9, 6, 3.5-4.5, 4.5-5, 5-5.5, 5.5-6, or 6-7 eV, etc.). The layer is preferably arranged near (e.g., adjacent to) the semiconductor layers 110 (e.g., just superficial of the semiconductor layers), such as between the semiconductor layers and another supplemental layer (e.g., another oxide layer, such as titanium oxide). In a specific example, the semiconductor layers include (e.g., are made substantially of) silicon, and the supplemental layers include a thin layer of manganese oxide and/or molybdenum oxide arranged between the silicon and a titanium oxide layer. However, the work function tuning layer 150 can additionally or alternatively include any other suitable materials.

In one embodiment, the anode 100 includes a single supplemental layer 105 that performs a plurality of the above functions. For example, the supplemental layer 105 can be a metal oxide (e.g., titanium oxide). The metal oxide can function, for example, as an electronic protection layer 120, an electronic population control layer 125, an electron capture layer 130, and/or a chemical protection layer 140. In this embodiment, the anode 100 can optionally include additional supplemental layers 105 (e.g., to perform additional functions, to supplement the functions of the first supplemental layer, etc.). For example, the metal oxide layer can be arranged just superficial of the semiconductor layers, and a work function tuning layer 150 (e.g., Cs coating) can be arranged just superficial of the metal oxide layer. However, the supplemental layers 105 can additionally or alternatively have any other suitable arrangement, include any other suitable materials, and/or provide any other suitable functions.

1.1.3 Electrical Contact

The electrical contact 160 can function to extract electrons from the anode 100 (e.g., to drive an electrical load). The electrical contact 160 is preferably arranged on the second side of the anode, but can additionally or alternatively be arranged on the first side (e.g., laterally patterned such as a ring contact, thin continuous layer, etc.), between the sides (e.g., within the anode 100), and/or have any other suitable arrangement. The electrical contact 160 is preferably electrically connected to one or more of the semiconductor layers 110, more preferably forming a good electrical contact (e.g., ohmic contact; Schottky contact with negligible or minimal energy barrier relative to the anode operating temperature, such as 0.01, 0.05, 0.1, 0.2, 0.5, 0.75, 1, 1.5, 2, 2.5, 3, 4, 5, 10, 0.01-0.1, 0.1-0.5, 0.5-1.5, 1.5-3, 3-5, 5-10, 10-20, or 20-50 times $k_BT$ at the anode operating temperature; etc.) to the semiconductor.

The electrical contact 160 optionally includes an adhesion layer, which can function to enhance electrical contact adhesion to the semiconductor. The adhesion layer is preferably arranged adjacent to (e.g., deposited directly onto) the semiconductor layers, but can additionally or alternatively have any other suitable arrangement. For example, the adhesion layer can include a coating, preferably a thin (e.g., 1-10 nm, 0.1-1 nm, 10-30 nm, etc.) coating but alternatively a coating of any suitable thickness, of titanium (e.g., which can additionally or alternatively function to scavenge oxygen, thereby preventing oxidation of the semiconductor) and/or other metals that adhere well to the semiconductor (e.g., deposited onto the semiconductor).

The electrical contact 160 preferably includes a diffusion barrier, which can function to prevent metal species (e.g., of the electrical contact) from diffusing into and/or reacting with the semiconductor layers. Thus, the diffusion barrier is preferably arranged between the semiconductor layers and the majority of the electrical contact (e.g., wherein only the adhesion layer separates the diffusion barrier from the semiconductor layers). In a first example, the diffusion barrier includes one or more metals that do not readily react with the semiconductor (e.g., for a silicon bulk semiconductor, do not form silicides) at the anode operating temperature, such as molybdenum and/or tungsten. In this example, the diffusion barrier is preferably tens of nm thick (e.g., 10-100 nm, such as 10-25, 20-50, 40-70, 50-60, 60-80, or 80-100 nm), but can alternatively be thicker than 100 nm or thinner than 10 nm. In a second example, the diffusion barrier includes one or more compounds (e.g., nitrides, oxides, etc.) of metals and/or other species (e.g., titanium nitride, tantalum nitride, etc.), which can function to prevent metal diffusion. In this example, the diffusion barrier is preferably sufficiently thin to allow efficient electron transport across the barrier (e.g., 0-1, 1-2, 2-5, 5-10, 10-20 nm, etc.), but can alternatively have any other suitable thickness. However, the diffusion barrier can additionally or alternatively include any suitable materials in any suitable configuration.

The electrical contact 160 preferably includes a thick (e.g., greater than a threshold thickness, such as 100 or 1000 nm), low-resistance metal structure, which can efficiently conduct (e.g., laterally, out-of-plane, etc.) device currents in excess of 1 or 10 A/cm$^2$. This structure can include a continuous layer, bus bars and/or wires, and/or any other suitable elements. The structure can be formed on and/or attached to the anode by electrodeposition, wafer bonding, and/or any other suitable fabrication technique.

The electrical contact 160 is preferably optically reflective (e.g., in embodiments in which the electrical contact 160 is arranged on the second side, whereby light reaching the electrical contact 160 can be reflected back through the anode 100 and/or to the cathode 200), but can additionally or alternatively absorb and/or transmit incident light. The electrical contact 160 (and/or other elements near the anode second side, such as proximal the second side relative to the semiconductor layers) can additionally or alternatively include a textured topography (e.g., pyramidal or inverse pyramidal, domed, etc.), which can function to promote light scattering (e.g., increasing photon path length within the semiconductor material, thereby increasing absorption).

The electrical contact 160 preferably includes (e.g., is preferably made of) one or more metals, metal compounds (e.g., silicides, oxides, etc.), and/or layered stacks thereof (e.g., Pt deposited after Ti and/or Ni). In a first variation, in which the bulk semiconductor 111 is silicon, the electrical contact 160 makes ohmic contact to silicon (e.g., Al, Al—Si, TiSi$_2$, TiN, W, MoSi$_2$, PtSi, CoSi$_2$, WSi$_2$, etc.). In a second variation, in which the bulk semiconductor 111 is GaAs, the electrical contact 160 makes ohmic contact to GaAs (e.g., AuGe, PdGe, PdSi, Ti/Pt/Au, etc.). However, the electrical contact 160 can additionally or alternatively include any other suitable materials.

1.1.4 Examples

In one embodiment, the anode 100 includes a bulk semiconductor 111, preferably includes an electrical contact 160 on the back side of the bulk semiconductor 111 (e.g., proximal the anode second side), preferably includes a work function tuning layer 150 (e.g., Cs or Cs—O coating), such as at the anode first side, and optionally includes one or more additional layers (e.g., intermediary layers arranged between the bulk semiconductor 111 and the work function tuning layer 150; in the absence of a work function tuning layer, layers arranged superficial of the bulk semiconductor 111; etc.). For example, the bulk semiconductor can be a bulk n-type silicon wafer, such as a 50-250 µm thick wafer (e.g., 100 µm, 200 µm, etc.) and/or a wafer with an equilibrium carrier concentration of $10^{16}$-$10^{18}$/cm$^3$ (e.g., $10^{16}$, $2\times10^{16}$, $5\times10^{16}$, $7.5\times10^{16}$, $10^{17}$, $2\times10^{17}$, etc.).

It can be instructive to compare (measured and/or calculated) band diagrams of such structures in the dark and under illumination. The typical illumination expected during device operation, such as received from cathode thermal radiation, may fall in the range of $10^{13}$-$10^{21}$ cm$^{-2}$ s$^{-1}$ above-gap photons, more typically (e.g., for a tungsten or molybdenum cathode at a temperature of 1300-2000° C. and a silicon anode) $10^{15}$-$10^{20}$ cm$^{-2}$ s$^{-1}$ (e.g., for a 300° C. silicon anode and a 1500° C. tungsten cathode, typically $10^{16}$-$10^{18}$ cm$^{-2}$ s$^{-1}$, such as approximately $4\times10^{17}$ cm$^{-2}$ s$^{-1}$), but the illumination can additionally or alternatively be greater than $10^{21}$ cm$^{-2}$ s$^{-1}$ (e.g., $10^{21}$-$10^{25}$ cm$^{-2}$ s$^{-1}$, greater than $10^{25}$ cm$^{-2}$ s$^{-1}$, etc.), less than $10^{13}$ cm$^{-2}$ s$^{-1}$ (e.g., $10^9$-$10^{13}$ cm$^{-2}$ s$^{-1}$, less than $10^9$ cm$^{-2}$ s$^{-1}$, etc.), and/or have any other suitable value. However, band diagrams of such structures under elevated illumination, such as 10,000 suns illumination, can also be instructive. These band diagrams can illustrate the potential and/or realized effects of the photovoltage-based work function reduction, which may typically scale approximately logarithmically with the illumination intensity.

Figure 5:
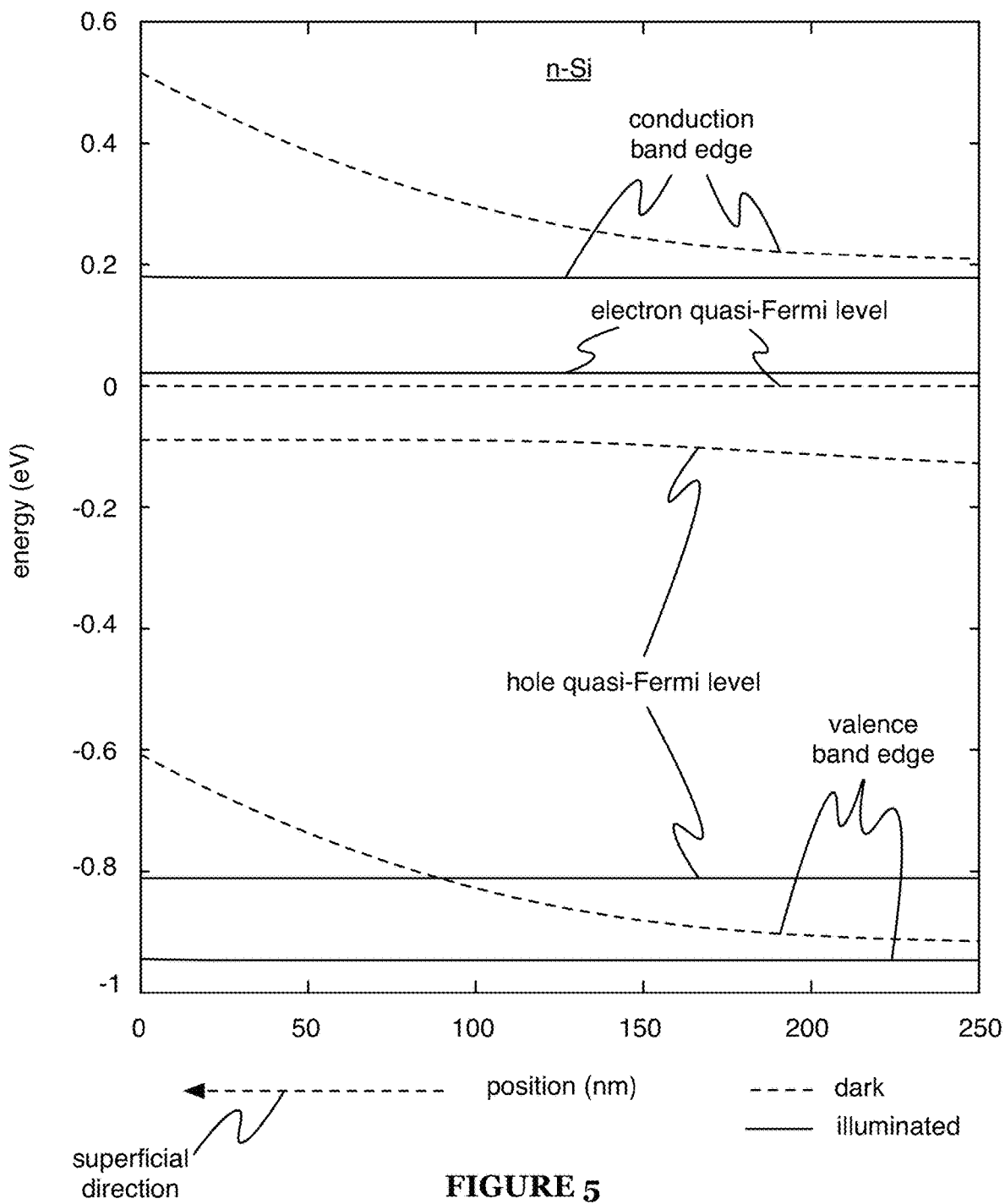
FIGS. 5-7 are representations of a calculated band diagram of a first, second, and third specific example of an anode, respectively, without and with illumination.

In a first example, there is no additional layer, and there is optionally a work function tuning layer 150 (e.g., Cs, Cs—O, etc.) at the anode first side. For a specific example of such an anode, with a 100 µm thick n-type silicon wafer doped to an equilibrium carrier concentration of $10^{17}$/cm$^3$, calculated band diagrams in the dark (dashed lines) and under 10,000 suns illumination (solid lines) are shown in FIG. 5.

Figure 6:
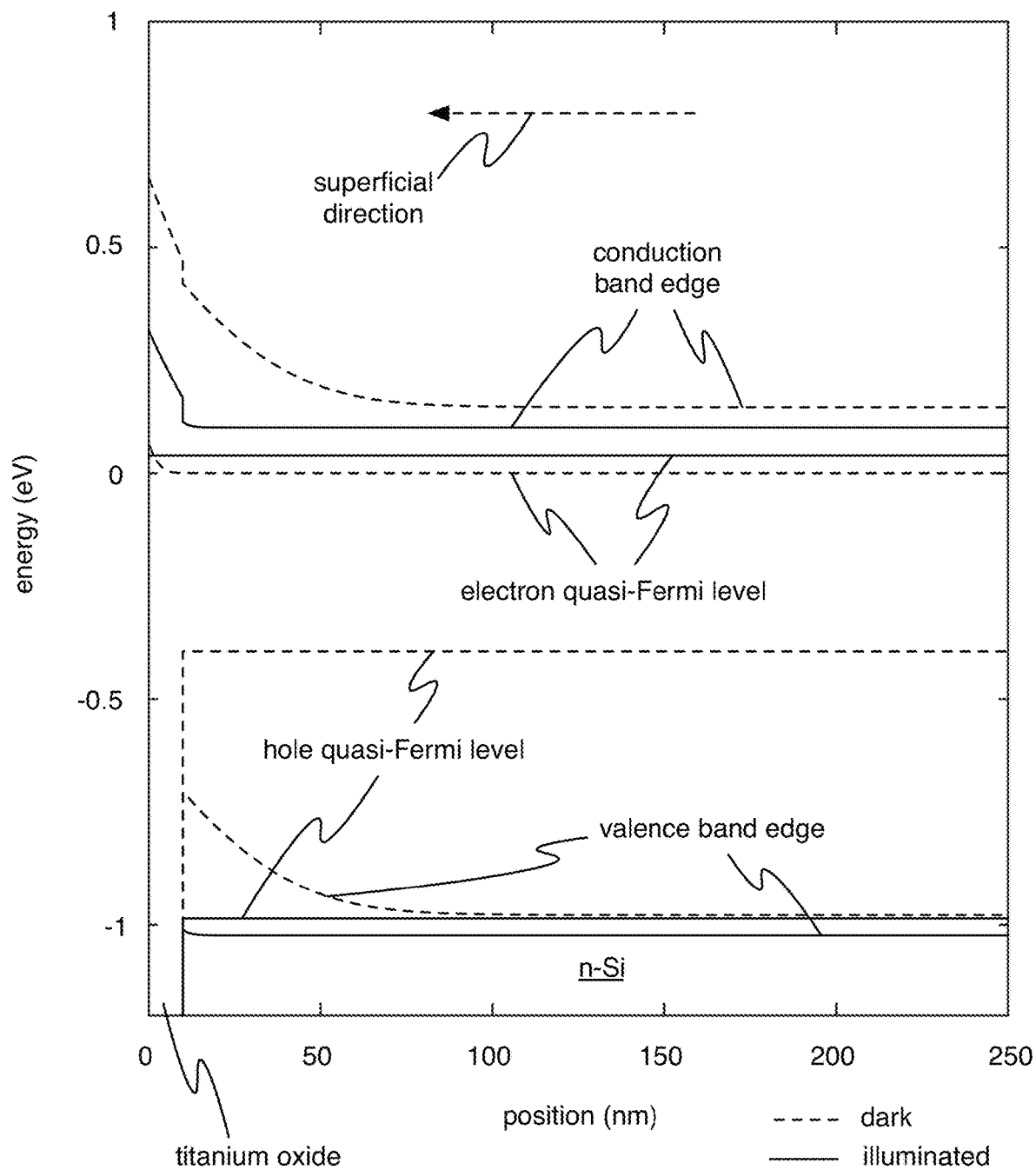

In a second example, there is optionally a work function tuning layer 150 (e.g., Cs, Cs—O, etc.) at the anode first side, and the anode includes a titanium oxide layer, preferably 3-25 nm thick (e.g., 3-10 nm, 5-15 nm, 10-25 nm, etc.). The titanium oxide layer is preferably deposited by atomic layer deposition (e.g., thermal, plasma, etc.), but can additionally or alternatively be formed in any other suitable manner. The titanium oxide layer is preferably adjacent the bulk semiconductor, but can alternatively be in any other suitable arrangement. For a specific example of such an anode, with a 10 nm thick titanium oxide layer adjacent a 100 µm thick n-type silicon wafer doped to an equilibrium carrier concentration of $10^{17}$/cm$^3$, calculated band diagrams in the dark (dashed lines) and under 10,000 suns illumination (solid lines) are shown in FIG. 6.

Figure 7:
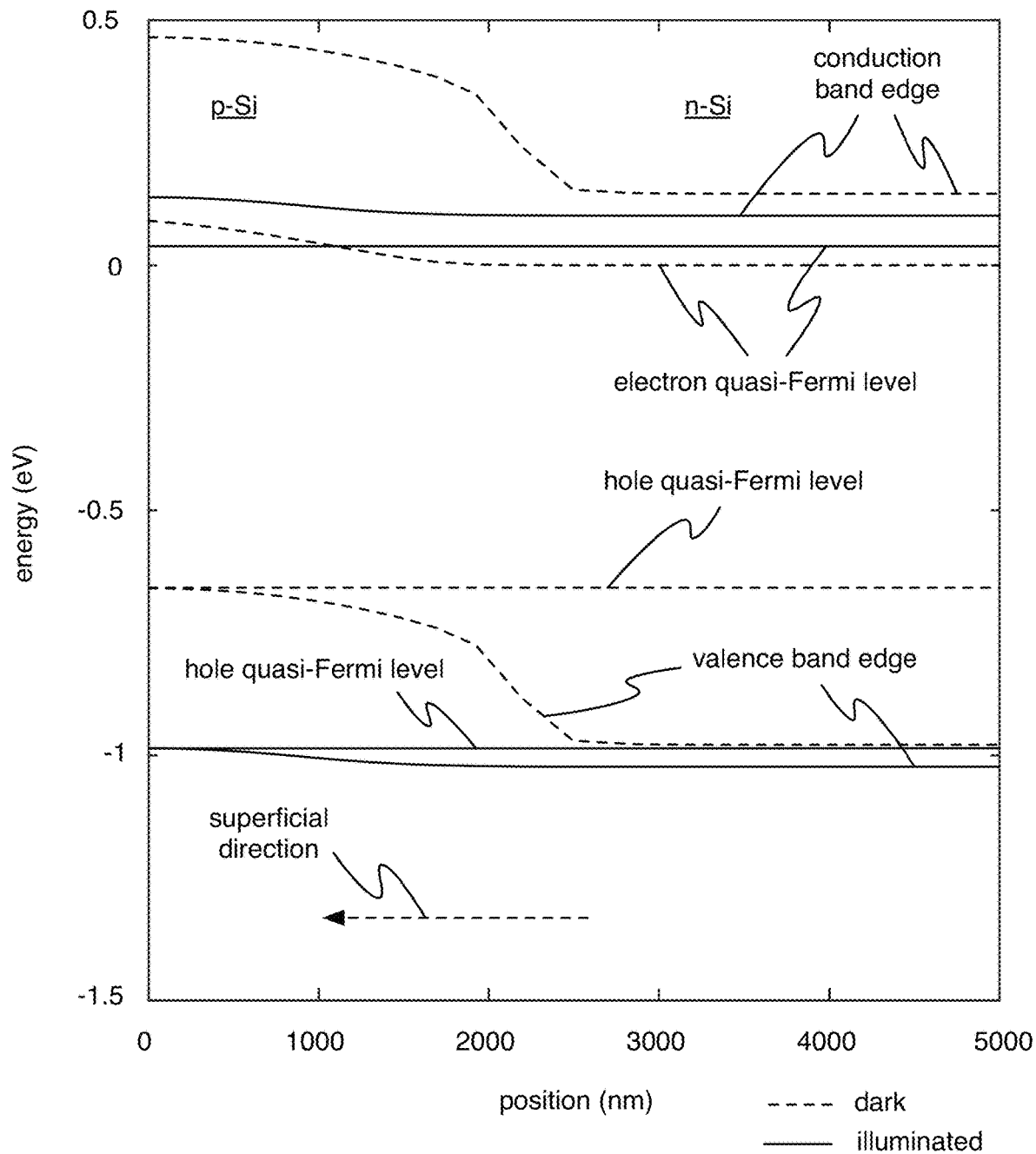

In a third example, there is optionally a work function tuning layer 150 (e.g., Cs, Cs—O, etc.) at the anode first side, and the anode includes a p-type silicon layer adjacent the bulk semiconductor (e.g., formed by ion implantation into the n-type silicon wafer, such as implantation of $4\times10^{15}$/cm$^2$ boron ions at 15 keV). For a first specific example of such an anode, with a 100 µm thick n-type silicon wafer doped to an equilibrium carrier concentration of $10^{17}$/cm$^3$, calculated band diagrams in the dark (dashed lines) and under 10,000 suns illumination (solid lines) are shown in FIG. 7. In a second specific example, the anode optionally includes one or more of a high work function metal (e.g., iridium) and a compound with electronic defects near the semiconductor valence band (e.g., titanium oxide), arranged superficial of the semiconductor layers (e.g., when a work function tuning layer is present, arranged between the semiconductor layers and the work function tuning layer). When both the metal and the compound are present, the metal is preferably arranged superficial of the compound, but can alternatively be arranged between the semiconductor layers and the compound.

In a fourth example, the anode includes a device such as described in *Application of Semiconductors to Thermionic Energy Converters* by Daniel C. Riley, which is hereby incorporated in its entirety by this reference (e.g., as described in Chapter 4, entitled "Surface Photovoltage"), modified to include one or more additional layers such as those described above (e.g., intermediary layers arranged between the bulk semiconductor 111 and the work function tuning layer 150; in the absence of a work function tuning layer, layers arranged superficial of the bulk semiconductor 111; etc.). In a specific example, the anode includes a device such as described in Riley's Chapter 4, but modified to include a work function reduction layer (e.g., Cs, Cs—O, etc.) and a compound (e.g., thin layer of the compound, such as 3-30 nm, 0.3-3 nm, 30-60 nm, etc.) with electronic defects near the semiconductor valence band (e.g., titanium oxide), wherein the compound is arranged between the semiconductor and the work function reduction layer.

However, the anode 100 can additionally or alternatively include any other suitable elements (e.g., layers) in any suitable arrangement.

1.2 Cathode

The cathode 200 can function to emit electrons (e.g., thermionically). The cathode 200 is preferably substantially planar (e.g., is a flat wafer), but can additionally or alternatively define any suitable shape. The cathode 200 can optionally include surface textures, lateral features, and/or any other suitable features.

The cathode 200 preferably includes (e.g., is preferably made of) one or more metals (e.g., refractory metals), and can additionally or alternatively include semiconductors, insulators, and/or any other suitable materials. The cathode 200 can include a work function tuning layer (e.g., as described above regarding the anode work function tuning layer 150, otherwise). The cathode 200 preferably has a low work function (e.g., less than a threshold value, such as 4 eV, 3.5 eV, 3 eV, 2.5 eV, 2 eV, 1.5 eV, 1 eV, 0.5-5 eV, etc.), but can additionally or alternatively have any suitable work function.

The cathode 200 can optionally include elements that function to control photon transfer from the cathode to the anode (e.g., working alone and/or in cooperation with the anode optical tuning layer 145). For example, the cathode can include a material (e.g., metal, such as tungsten or molybdenum) that exhibits favorable emissivity (e.g., higher emissivity of above-gap photons than below-gap photons), such as including a bulk portion of the material (e.g., wherein the material thermionically emits electrons and forms a conductive portion of the TEC circuit). The cathode can additionally or alternatively include one or more additional layers (e.g., surface layers) configured to alter its optical properties, such as by enhancing above-gap photon emission and/or depressing below-gap photon emission. Such layers are preferably thin (e.g., less than 1 nm, 1-3 nm, 3-10 nm, 10-30 nm, etc.), to minimize their interference with thermionically emitted electrons, but can alternatively have any suitable thickness. Such layers can include metal and/or semiconductor compounds (e.g., oxides, nitrides, etc.) and/or any other suitable materials. However, the cathode 200 can additionally or alternatively include any other suitable elements in any suitable arrangement.

1.3 System Arrangement

The anode 100 and cathode 200 are preferably coupled, more preferably fixed relative to each other. The anode 100 and cathode 200 are preferably substantially parallel (e.g., a broad face of the anode 100 substantially parallel a broad face of the cathode 200). The first side of the anode preferably faces the cathode 200.

The anode 100 and cathode 200 preferably define a small gap cooperatively (e.g., between the broad faces). The gap can define an inter-electrode spacing in the range 100 nm-1 mm (preferably 1-10 μm), less than 100 nm, greater than 1 mm, and/or any other suitable spacing. The gap can be defined and/or maintained by spacers (e.g., separating the anode 100 and cathode 200), pockets (e.g, wherein a broad face of the anode and/or cathode is at the bottom of a pocket), and/or any other suitable spacing elements. The system 10 preferably includes a vacuum environment and/or other isolated environment (e.g., isolated from an ambient environment surrounding the system) within the gap. For example, the system 10 can include a system enclosure that functions (e.g., alone; in cooperation with the cathode, anode, spacers, and/or other system elements; etc.) to enclose the gap and/or isolate it from the ambient environment. The anode 100 and cathode 200 can be coupled by wafer bonding, mechanical fasteners, and/or any other suitable coupling elements.

The system 10 preferably includes electrical leads electrically coupling each electrode to an electrical load (e.g., resistive load), such as an anode lead electrically connected to the anode electrical contact 160 and a cathode lead electrically connected to a cathode electrical contact (e.g., forming a thermionic energy converter configured to generate an electrical power output using a thermal power input).

The system 10 can optionally include additional electrodes, such as one or more electrodes (e.g., gate electrodes) arranged between the cathode 200 and anode 100. For example, the system 10 can include an electron-transmissive gate electrode (e.g., grid, electron-transparent material, etc.) supported (e.g., from the enclosure, cathode, anode, etc.) between the cathode and anode, such as by electrically and/or thermally conductive and/or insulating supports. However, the system 10 can additionally or alternatively include any other suitable components in any other suitable arrangement.

2. Method

Figure 3A:
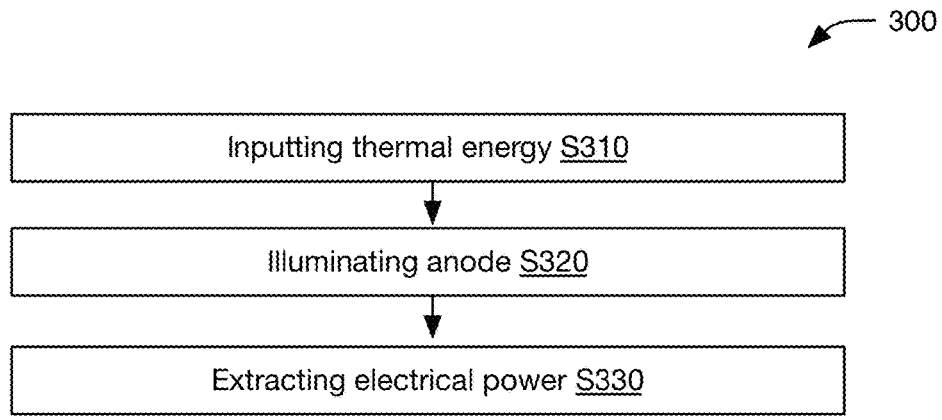
FIG. 3A is a schematic representation of the method.
Figure 3B:
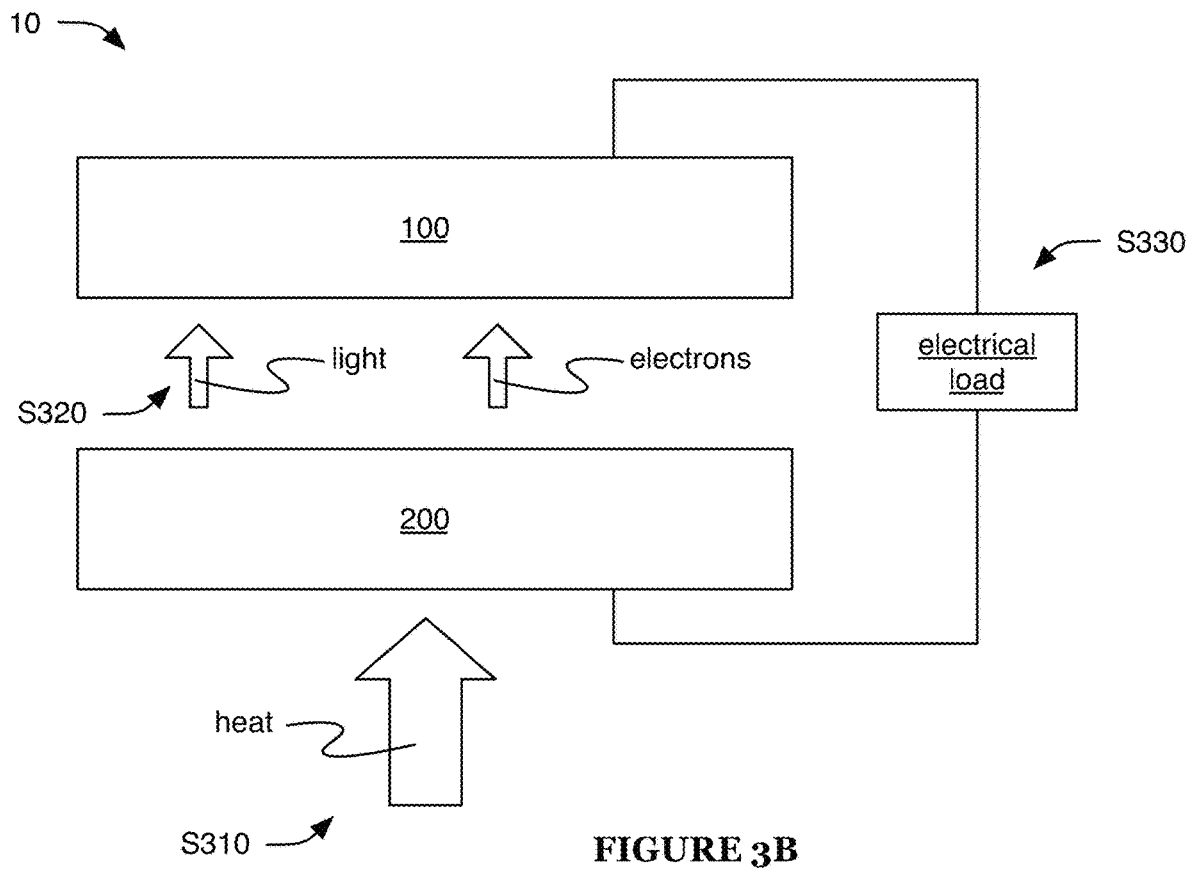
FIG. 3B is a schematic representation of an embodiment of the method.

A method 300 for work function reduction and/or thermionic energy conversion can include inputting thermal energy to a system S310, illuminating an anode of the system S320, and/or extracting electrical power from the system S330 (e.g., as shown in FIGS. 3A-3B). The method 300 can be performed using the system 10 described above and/or any other suitable system.

Inputting thermal energy S310 can function to maintain a cathode of the system at elevated temperature (e.g., 300-2500° C.). Electrons can thermionically emit from the cathode (e.g., toward the anode). The electrons preferably travel across a small vacuum gap separating the cathode and anode. The emission current is preferably high (e.g., greater than a threshold current, such as 10 A/cm$^2$, 1 A/cm$^2$, 0.1 A/cm$^2$, etc.), but can additionally or alternatively be moderate and/or low (e.g., less than the threshold current). S310 can optionally maintain the anode at an elevated temperature. The anode temperature is preferably in the range 250-350° C. (e.g., approximately 300° C.), but can additionally or alternatively be greater than 350° C. (e.g., 350-450° C., 450-550° C., 550-650° C., 650-800° C., 800-1000° C., greater than 1000° C.), less than 250° C. (e.g., an ambient temperature such as 15-25° C., less than 15° C., 25-75° C., 75-150° C., 150-250° C.), and/or any other suitable temperature.

Figure 4A:
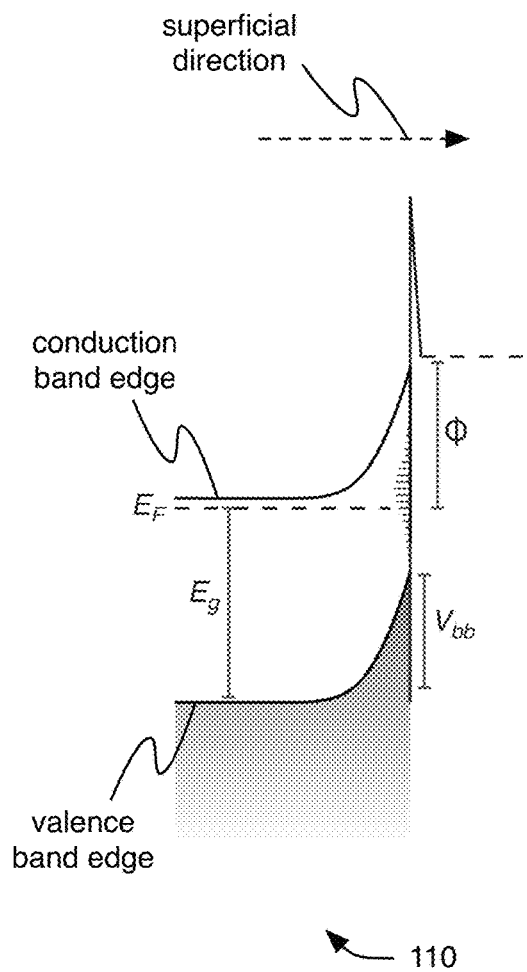
FIGS. 4A-4B are schematic representations of a band diagram of an embodiment of an anode, without and with illumination, respectively.
Figure 4B:
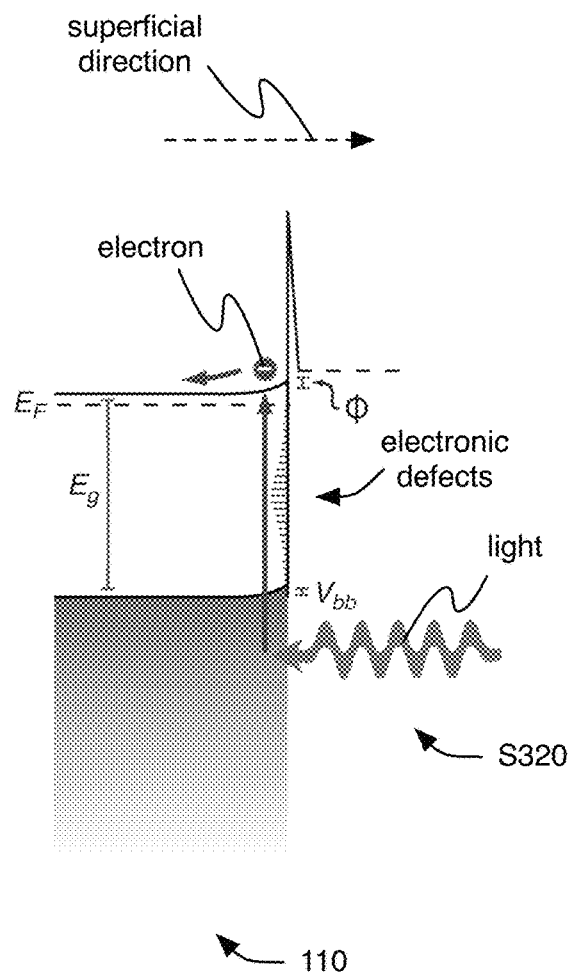
Figure 8:
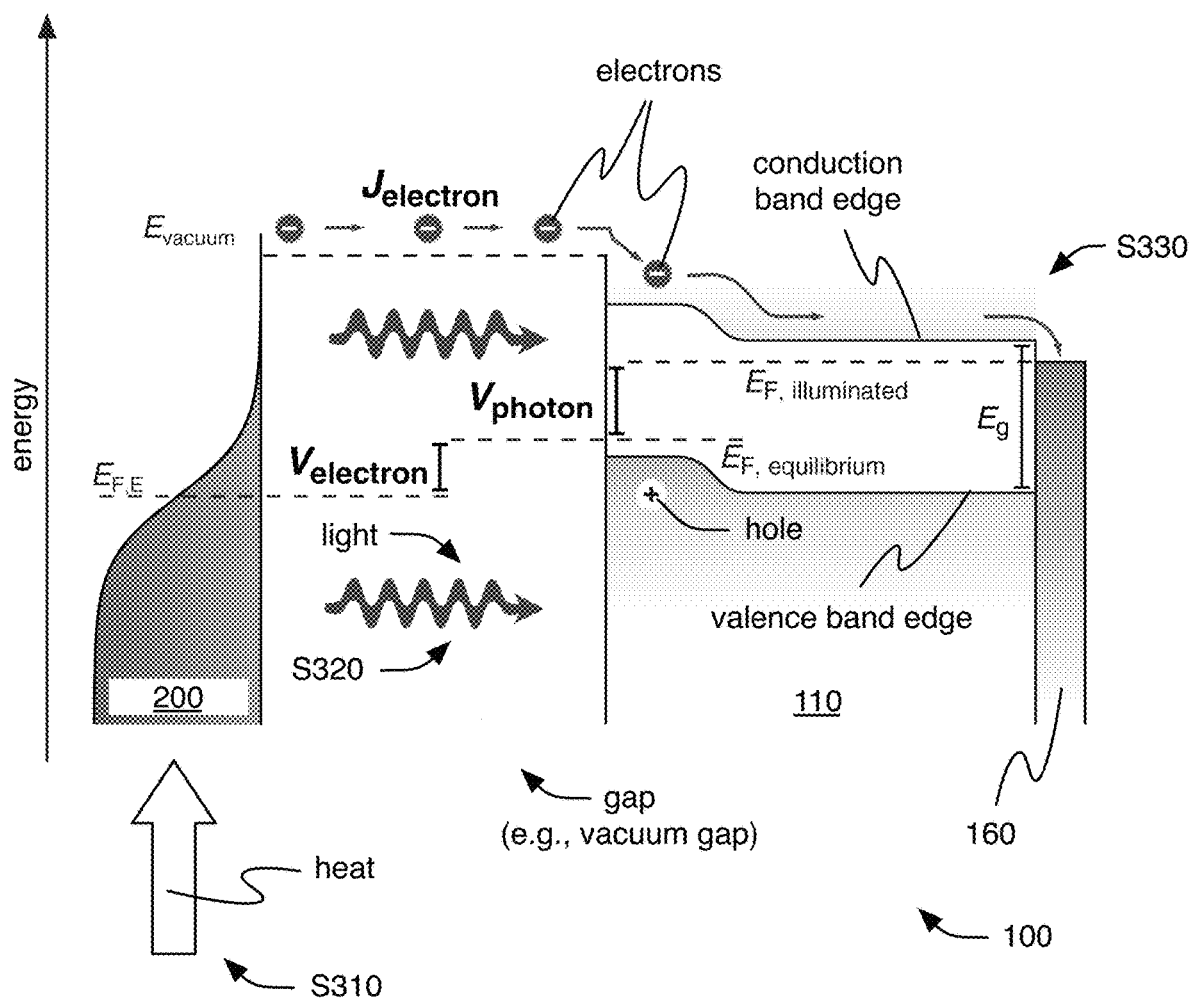
FIG. 8 is a schematic representation of a band diagram of an embodiment of the system.

Illuminating the anode S320 can function to cause a photovoltage effect (e.g., as shown in FIGS. 4A-4B and/or FIG. 8). S320 preferably reduces the anode work function (e.g., due to the photovoltaic effect). The reduction in anode work function due to the photovoltaic effect (e.g., the difference in anode work function with and without (or substantially without) anode illumination, such as the difference between a dark work function and an illuminated work function) is preferably greater than a threshold amount (e.g., 25, 50, 75, 100, 150, 200, 250, 300, 350, 400, 450, 500, 550, 600, 650, 700, 750, 800, 900, 1000, 1250, 1500, 0-25, 10-50, 50-200, 100-300, 200-400, 300-500, 400-750, 700-1000, or 1000-2000 meV, etc.), but can alternatively be a reduction of any suitable amount.

The light illuminating the anode preferably includes photons with energy greater than a bandgap of a semiconductor of the anode (e.g., the photons absorbed by and exciting band-to-band transitions in the semiconductor). The light intensity is preferably 1-10 mW/cm$^2$ (e.g., approximately 5 mW/cm$^2$), but can additionally or alternatively be less than 1 mW/cm$^2$, greater than 10 mW/cm$^2$, and/or have any other suitable intensity. The light is preferably emitted by the cathode (e.g., thermal radiation from the cathode), but can additionally or alternatively include light emitted (e.g., thermally emitted) by other elements of the system (e.g., enclosure, spacers, gate, plasma, etc.), ambient light, light from a dedicated light source (e.g., LED arranged near the anode), and/or any other suitable light.

Extracting electrical power S330 can function to use the power output by the system. S330 preferably includes using the thermionic current from the system to power an electrical load (e.g., thermionically emitted electrons travelling from the cathode to the anode, then through an anode electrical lead to an electrical load, and finally through a cathode electrical lead back to the cathode).

In one embodiment, the method 300 preferably includes: heating the cathode; emitting light from the cathode (e.g., due to thermal radiation); absorbing light (e.g., the light emitted from the cathode) at the anode (e.g., at an n-type semiconductor of the anode), wherein a work function of the anode is preferably reduced in response to absorbing the light; emitting electrons from the cathode (e.g., thermionically); capturing electrons (e.g., the thermionically emitted electrons) at the anode (e.g., at the electron capture layer, at the semiconductor layers, etc.), preferably substantially concurrent with absorbing the light; and/or providing all or some of the captured electrons as electrical power (e.g., wherein the electrons flow from the anode, through the electrical load, to the cathode).

However, the method 300 can additionally or alternatively include any other suitable elements.

Although omitted for conciseness, the preferred embodiments include every combination and permutation of the various system components and the various method processes. Furthermore, various processes of the preferred method can be embodied and/or implemented at least in part as a machine configured to receive a computer-readable medium storing computer-readable instructions. The instructions are preferably executed by computer-executable components preferably integrated with the system. The computer-readable medium can be stored on any suitable computer readable media such as RAMs, ROMs, flash memory, EEPROMs, optical devices (CD or DVD), hard drives, floppy drives, or any suitable device. The computer-executable component is preferably a general or application specific processing subsystem, but any suitable dedicated hardware device or hardware/firmware combination device can additionally or alternatively execute the instructions.

The FIGURES illustrate the architecture, functionality and operation of possible implementations of systems, methods and computer program products according to preferred embodiments, example configurations, and variations thereof. In this regard, each block in the flowchart or block diagrams may represent a module, segment, step, or portion of code, which comprises one or more executable instructions for implementing the specified logical function(s). It should also be noted that, in some alternative implementations, the functions noted in the block can occur out of the order noted in the FIGURES. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

As a person skilled in the art will recognize from the previous detailed description and from the figures and claims, modifications and changes can be made to the preferred embodiments of the invention without departing from the scope of this invention defined in the following claims.

We claim:

1. A thermionic energy converter (TEC) comprising:
   an anode comprising:
      an n-type semiconductor;
      a work function reduction layer; and
      an electronic protection layer arranged between the n-type semiconductor and the work function reduction layer, wherein the electronic protection layer comprises at least one of: a semiconductor or an insulator;
   a cathode, wherein the TEC defines a gap between the anode and the cathode;
   an enclosure isolating the gap from an ambient environment proximal the TEC; and
   an electrical load electrically coupling the cathode to the anode.

2. The TEC of claim 1, wherein the electronic protection layer comprises a transition metal oxide.

3. The TEC of claim 2, wherein the transition metal oxide comprises at least one element selected from the group consisting of: titanium, tantalum, zirconium, molybdenum, tungsten, niobium, and hafnium.

4. The TEC of claim 3, wherein the electronic protection layer consists essentially of titanium oxide.

5. The TEC of claim 3, wherein the transition metal oxide comprises molybdenum.

6. A thermionic energy converter (TEC) comprising:
   an anode comprising:
      an n-type semiconductor;
      a work function reduction layer; and
      an electronic protection layer arranged between the n-type semiconductor and the work function reduction layer, wherein the electronic protection layer has a thickness between 1 nm and 100 nm, wherein the electronic protection layer comprises a transition metal oxide;
   a cathode, wherein the TEC defines a gap between the anode and the cathode;
   an enclosure isolating the gap from an ambient environment proximal the TEC; and
   an electrical load electrically coupling the cathode to the anode.

7. The TEC of claim 1, wherein the electronic protection layer has a thickness between 1 nm and 25 nm.

8. The TEC of claim 1, wherein the anode further comprises an electrical contact, wherein the n-type semiconductor is arranged between the electrical contact and the electronic protection layer.

9. The TEC of claim 8, wherein the electrical contact comprises a transition metal.

10. The TEC of claim 8, wherein the electrical contact comprises a metallic layer and an adhesion layer of different composition from the metallic layer, wherein the adhesion layer is arranged between the n-type semiconductor and the metallic layer.

11. The TEC of claim 10, wherein:
the metallic layer comprises a first transition metal; and
the adhesion layer comprises a second transition metal.

12. The TEC of claim 11, wherein:
the adhesion layer has a thickness greater than 10 nm; and
the metallic layer has a thickness greater than 100 nm.

13. The TEC of claim 8, wherein the electrical contact makes ohmic contact to the n-type semiconductor.

14. The TEC of claim 8, wherein the electrical contact comprises a metallic layer and a diffusion barrier of different composition from the metallic layer, wherein the diffusion barrier is arranged between the n-type semiconductor and the metallic layer.

15. The TEC of claim 1, wherein the n-type semiconductor is selected from the group consisting of: n-type silicon, n-type silicon carbide, n-type germanium, and an n-type III-V semiconductor.

16. The TEC of claim 15, wherein the n-type semiconductor is a bulk semiconductor of substantially uniform doping.

17. The TEC of claim 1, wherein the n-type semiconductor is selected from the group consisting of: n-type silicon, n-type gallium arsenide, n-type aluminum gallium arsenide, n-type gallium indium phosphide, and n-type aluminum gallium indium phosphide.

18. The TEC of claim 17, wherein the n-type semiconductor is a bulk semiconductor.

* * * * *